(12) United States Patent
Hettler et al.

(10) Patent No.: US 11,862,941 B2
(45) Date of Patent: Jan. 2, 2024

(54) MULTI-LASER ARRANGEMENT, IN PARTICULAR AN RGB LASER MODULE DEVICE

(71) Applicant: SCHOTT AG, Mainz (DE)

(72) Inventors: Robert Hettler, Kumhausen (DE); Amy Soon Li Ping, Singapore (SG); Ong Wai Li, Johor Bahru (MY); Artit Aowudomsuk, Bangkok (TH)

(73) Assignee: Schott AG, Mainz (DE)

( * ) Notice: Subject to any disclaimer, the term of this patent is extended or adjusted under 35 U.S.C. 154(b) by 318 days.

(21) Appl. No.: 17/235,582

(22) Filed: Apr. 20, 2021

(65) Prior Publication Data
US 2021/0328412 A1    Oct. 21, 2021

(30) Foreign Application Priority Data

Apr. 20, 2020    (DE) .................... 10 2020 110 658.0

(51) Int. Cl.
*H01S 5/40*    (2006.01)
*H01S 5/02315*    (2021.01)
(Continued)

(52) U.S. Cl.
CPC .......... *H01S 5/4093* (2013.01); *H01S 5/0014* (2013.01); *H01S 5/02218* (2021.01);
(Continued)

(58) Field of Classification Search
CPC .................... H01S 5/02255; H01S 5/02218
(Continued)

(56) References Cited

U.S. PATENT DOCUMENTS 5,436,920 A    7/1995   Minemoto et al.
9,509,116 B2   11/2016  Breidenassel et al.
(Continued)

FOREIGN PATENT DOCUMENTS

DE    10 2011 081 417 A1    9/2012
DE    10 2018 106 685 A1    9/2019
(Continued)

OTHER PUBLICATIONS

Notification of the Transmission of the International Search Report and Written Opinion of the International Search Authority or Declaration dated Jul. 1, 2021 for International Application No. PCT/EP2021/060213 (16 pages).

*Primary Examiner* — Tuan N Nguyen
(74) *Attorney, Agent, or Firm* — Taylor IP, P.C.

(57) ABSTRACT

A multi-laser arrangement, in particular an RGB laser module, having a housing with a housing cap having at least one opening formed therein and a transparent element associated therewith for the passing of electromagnetic radiation. The housing cap coupled to a base plate. A first laser emitting in the red spectral range, a second laser emitting in the green spectral range, and a third laser emitting in the blue spectral range are arranged in the housing. An electrical connection line is routed through the housing to each respective laser. During operation of a laser, a majority of its emitted light passes through the transparent element. Each laser is arranged on a pedestal; spaced apart from the lower surface of the base plate; and is aligned with one another. The main direction of laser emission is substantially parallel to the base plate of the housing.

36 Claims, 25 Drawing Sheets
(25 of 25 Drawing Sheet(s) Filed in Color)

(51) Int. Cl.
  *H01S 5/02257* (2021.01)
  *H01S 5/02253* (2021.01)
  *H01S 5/02251* (2021.01)
  *H01S 5/00* (2006.01)
  *H01S 5/02218* (2021.01)
  *G02B 27/01* (2006.01)
  *G03B 21/20* (2006.01)

(52) U.S. Cl.
  CPC ...... *H01S 5/02251* (2021.01); *H01S 5/02253* (2021.01); *H01S 5/02257* (2021.01); *H01S 5/02315* (2021.01); *H01S 5/4031* (2013.01); *G02B 27/0172* (2013.01); *G03B 21/2033* (2013.01)

(58) Field of Classification Search
  USPC ........................................ 372/29.011, 50.121
  See application file for complete search history.

(56) References Cited

U.S. PATENT DOCUMENTS 10,283,930 B2    5/2019  Reinert et al.
2008/0234560 A1  9/2008  Nomoto et al.
2009/0103574 A1  4/2009  Park
2011/0063871 A1  3/2011  Tanaka et al.
2012/0033700 A1  2/2012  Soejima et al.
2013/0044042 A1  2/2013  Olsson et al.
2014/0240952 A1  8/2014  Nakanishi et al.
2017/0141531 A1* 5/2017  Kyono .................. H01S 5/0236
2018/0010763 A1  1/2018  Kyono et al.
2019/0097381 A1* 3/2019  Miyata ..................... F21K 9/68
2019/0097722 A1  3/2019  McLaurin et al.
2019/0121141 A1* 4/2019  Dykaar ................ H01S 5/4075
2019/0229499 A1* 7/2019  Dawson ............... H01S 5/4075
2020/0194974 A1  6/2020  Kozuru et al.

FOREIGN PATENT DOCUMENTS

DE   10 2020 110 658 A1   10/2021
DE   20 2021 102 072 U1   6/2022
EP          1 285 303 B1   12/2004
WO         2019/067042 A1   4/2019
WO         2020/004100 A1   1/2020

* cited by examiner

MULTI-LASER ARRANGEMENT, IN PARTICULAR AN RGB LASER MODULE DEVICE

CROSS REFERENCE TO RELATED APPLICATIONS

This application claims priority to German Patent Application No. DE 10 2020 110 658.0 filed on Apr. 20, 2020, which is incorporated in its entirety herein by reference.

BACKGROUND OF THE INVENTION

1. Field of the Invention

The invention relates to a multi-laser arrangement, in particular an RGB laser module, and to devices comprising such multi-laser arrangement.

2. Description of the Related Art

With the steadily improving acquisition and digital processing of analog data, possibilities are created to not only represent this data digitally, but to add further virtual data to this digitized data, which provides a user with an expanded representation of reality, which is also referred to as Augmented Reality (AR).

Respective devices include, for example, glasses, also known as AR glasses, in which a projection device, usually attached to a temple arm, superimposes a virtual image on the natural image perceived through the glasses. Generically or generalizing, such devices are also referred to as head-mounted displays.

Such AR glasses, also referred to as Google glasses, are disclosed in US 2013/0044042 A1. Other AR glasses, referred to as Microsoft Hololens, are described in WO 2019/067042 A1.

EP 1 285 303 B1 describes a mobile system for generating a virtual display for a mobile phone, in which the display device comprises individually controllable cells operable in a passive or active mode, the cells being translucent in the passive mode and generating the image in the virtual display in the active mode. A drawback of this arrangement is that in the passive mode the cells might adversely influence the light passing therethrough.

A semiconductor laser and projector is described in DE 10 2018 106 685 A1, in which the carrier for the semiconductor chip is, for example, made of aluminum nitride or silicon carbide, which can be coated with Ti, Pt and/or Au for the contact surfaces and can be contacted mechanically and electrically, in particular by an AuSn soldering process. Heat conducting materials, for better thermal coupling of the semiconductor lasers with one another, but not as a carrier, are disclosed to include aluminum nitride, silicon carbide or diamond-like carbon, and a metal such as gold, platinum, nickel, palladium, titanium or silver, which is arranged between the semiconductor lasers.

In order to provide the greatest possible wearing comfort and high-quality viewing experience for the wearer of a head-mounted display or in particular of AR glasses, what is needed is electronically controllable light sources that are as compact as possible and provide electronically controlled colored light. Moreover, these light sources should advantageously be integrable into the further assemblies by which they are supported.

SUMMARY OF THE INVENTION

The present invention relates to a multi-laser arrangement, in particular, an RGB laser module including a housing having a base plate and a housing cap. The housing cap having at least one opening formed therein, and a transparent element associated therewith for the passing of electromagnetic radiation. Within the housing there is a first, a second and a third laser. The first laser emitting in particular in the red spectral range of the visible spectrum. The second laser emitting in particular in the green spectral range of the visible spectrum. The third laser emitting in particular in the blue spectral range of the visible spectrum. There is a respective electrical connection line routed through the housing to each laser. During operation of a laser, a majority of its emitted light passes through the transparent element. Each laser is arranged on a pedestal; is arranged spaced apart from the lower surface of the base plate; and the lasers are aligned with one another. The main direction of laser emission is substantially parallel to the base plate of the housing.

The use of a pedestal allows for a very defined arrangement of the lasers within the housing and for an optimization of the housing geometry, in particular its reduction in size while at the same time the majority of the emitted laser light is provided as usable light. Majority of emitted laser light is understood to mean a percentage of more than 80%, preferably more than 85%, and most preferably more than 90% of the light of a respective laser emitted through its end face in the direction of the transparent element.

Furthermore, the pedestal may be made of a material with a heat capacity and specific thermal conductivity that are defined by its size, inter alia, which allows the respective lasers to be deheated in a targeted manner during their operation, that is to selectively remove heat therefrom and dissipate this heat to the exterior of the housing.

Another advantage of this multi-laser arrangement is that it allows for separate electronic control of each respective laser, in particular also involving the base plate. Depending on the displayed color or intensity, i.e. luminance or chrominance of an optionally displayed image signal, not all lasers will emit simultaneously and may even be completely non-emitting during blanking or dark phases. As such the optical interaction between the respective lasers inside the housing is very low, so that even in the case of relatively high emissions, i.e. electronic full scale level, there will be no optical interaction between one of the lasers and one of the other lasers, in particular if the latter only emits with a significantly lower intensity, for example.

Another advantage over, for example, semiconductor arrangements that emit perpendicular to the base plate is that the RGB laser module can be better integrated, in particular, in applications that only provide limited space. Because in this case, the base plate may serve as a carrier component and may, for example, accommodate further optical assemblies, in particular in a manner so that they are adjusted relative to the light emitted by the lasers.

Generally, within the context of the present disclosure, blue spectral range is considered to be the range of wavelengths from 450 nm to 490 nm, green spectral range is the range of wavelengths from more than 490 nm to 560 nm, and red spectral range is the range of wavelengths from 630 nm to 700 nm. The presently disclosed multi-laser arrangement is able to provide a color space that is advantageous for the representation of visual signals.

Alternatively, more than one of the lasers or all lasers may emit light in the same spectral range, which can be advantageous when the multi-laser arrangement is used for lighting purposes, for example.

In the context of the present disclosure, "main direction of laser emission" is understood to mean the optical axis of the laser light emitted by the respective laser or at least the propagation direction of the maximum intensity based on the maximum of a lateral intensity distribution of the emitted laser light, and thus the direction of axial translation of the lateral intensity maximum.

For the sake of brevity, the wording "main emission direction" will be used synonymously for the main direction of laser emission in the context of the present disclosure.

The statement that the main direction of laser emission is substantially parallel to the base plate of the housing defines that this main direction of laser emission does not deviate vertically upwards by more than 5° or downwards by more than 5° from the plane defined by the lower surface of the base plate.

A particularly advantageous arrangement results when the housing cap comprises metal or is made of metal and when the base plate comprises metal or is made of metal, and when the housing cap is joined to the base plate by welding.

Here, the wording "comprises metal" is intended to disclose that, for example, a metallic body may be partially or completely covered by non-metallic coatings such as oxide layers or paints, in particular highly absorbent matt paints.

The joining of the housing cap to the base plate by welding brings considerable advantages for long-term operational durability of the multi-laser arrangement, as it is possible, in this way, to provide a fluid-tight and hermetically sealed bond between the housing cap and the base plate, which, for example, conforms to method 1014 of the MIL-STD 883 standard.

The soldering of such housings, for example, of a housing cap to a preferably metal-coated ceramic substrate as the base plate, often involves the use of fluxes such as formic acid in a nitrogen or hydrogen atmosphere, of which residues subsequently remain in the housing, and even traces thereof can already interact with and damage the semiconductor material of semiconductor lasers emitting in the blue spectral range.

This is not the case in the embodiment presently described, because here, the transparent element can first be mounted to the housing cap by a soldering process, for example, and only then, in particular after cleaning the housing cap, the welding process to the base plate may be performed. In this way it is possible to ensure that the atmosphere inside the housing contains less than 5000 ppm of $H_2O$ and that, thanks to the gas-tight design of the housing, this just permissible partial water pressure will not be exceeded over the entire service life of the component, in compliance with the MIL-883 standard, method 1018.

Advantages in terms of manufacturing technology result if the pedestal is formed integrally with the base plate, because in this case a correspondingly shaped base plate can be provided in a cost-efficient way by material-removing surface processing or by a stamping process.

However, if the base plate comprises or is made of a metal such as cold-rolled CRS1010 steel, and the pedestal is made of or comprises a different material than the base plate, in particular oxygen-free high conductivity (OFHC) copper, and the pedestal is preferably joined with the base plate by pressing, soldering, or welding, this allows to provide a pedestal that has a defined advantageous specific thermal conductivity and a thermal capacity that is defined by its structural dimensions, its specific thermal capacity and its material selection. This enables efficient temperature management through selective deheating of the respective lasers.

The above material details are only given by way of example and may instead also encompass other metals such as aluminum, steels, or stainless steels, and austenitic and ferritic stainless steels, but preferably only as far as they remain rust-free when carrying out the invention. Furthermore, in principle, titanium and Monell alloys with a high copper content can also be used, or else also melt-in alloys including NiFe alloys or NiFeCo alloys.

In further advantageous embodiments, a Fast Axis Collimation (FAC) lens is arranged on the pedestal, preferably spaced apart from the end face of the laser, in order to achieve the most efficient possible beam shaping with low intensity losses due to shading of a divergent beam of the emitted laser light.

The transparent element may most preferably comprise glass or be made of glass. In this case, the glass of the transparent element may comprise fused silica or borosilicate glass, for example. Furthermore, the transparent element may also be made of sapphire or comprise sapphire, in particular in the form of a crystalline material.

Generally, however, the transparent element exhibits transmittance of more than 80%, most preferably of more than 90% in a spectral range of wavelengths from 250 to 2000 nm as measured in the direction of the radiation emitted by the lasers.

For the purposes of the present disclosure, the wordings "light emitted by the lasers" and "radiation emitted by the lasers" are understood in the same sense and are used synonymously.

In a further embodiment of the present invention, the transparent element may be in the form of a fast axis collimation (FAC) lens or else may have a fast axis collimation (FAC) lens in particular attached thereto.

Alternatively, the transparent element may be in the form of an optical fiber board or may comprise an optical fiber board.

In preferred embodiments, the transparent element is fixed on the housing cap by a glass solder or is fixed on a frame arranged to the housing cap by a glass solder.

In further preferred embodiments of the present invention, which are desired to have smaller dimensions than the aforementioned embodiments in which glass solder is used to bond the transparent element to the housing cap, the transparent element may be held on the housing cap by a metallic solder, preferably AuSn solder.

Another embodiment of the present invention includes a transparent element that is welded to the housing cap.

If at least the wall of the housing cap, on which the transparent element is arranged, is inclined relative to the base plate, with an angle of inclination of the wall of the housing cap relative to the normal direction of the lower surface of the base plate in a range from 35° to 60°, preferably from 40° to 50°, most preferably from 43° to 48°. This allows the arrangement to very effectively suppress back reflection of the emitted light at the transparent element back into one or more of the lasers. In these designs, an anti-reflective coating of the transparent element can usually be dispensed with, without bringing about drawbacks for the functionality of the multi-laser arrangement due to reflected or scattered light.

The inclination angles α, as given above, are preferably selected for intentionally producing back reflection which is exploited for measuring the laser output power using monitor photodiodes, also referred to as monitor diodes here.

However, for suppressing direct back reflection into the laser resonator of the respective lasers of the RGB laser module, even smaller angles of typically 7° to 15°, for example, are sufficient.

Most advantageously, a monitor diode can be arranged below the transparent element, and laser light reflected back from the transparent element can be incident on the monitor diode so that a sensory signal can be obtained for the intensity of the light emitted by a respective laser associated with that monitor diode. In this way, a fast and effective feedback signal can be obtained, which enables the multi-laser arrangement to be driven precisely and in a controlled manner.

Here, the term "below" is to be understood relative to the base plate and the housing cap. Starting perpendicularly from the base plate towards the housing cap, i.e. in the normal direction, is understood to be directed upwards. In this sense, a body can thus be located above, below or at the same level as another body based on this direction. With reference to a Cartesian coordinate system described further below, "upward directed" also means the positive Z direction thereof.

Alternatively or additionally, monitor diodes may be arranged behind the lasers, in particular on a carrier associated therewith, wherein, preferably, each laser has at least one monitor diode of its own associated therewith and wherein this carrier includes conductive coatings as electrical connection lines for the respective monitor diode.

In the sense of the present disclosure, the light exit face of the laser facing the transparent element is defined as the front side and the propagation direction of the laser light exiting through this light exit face is defined as exiting in the "forward direction" or emitted in the "forward direction". The wording "arranged behind the lasers" defines a position which is located in front of the further light exit face of the laser, which is on the side facing away from the transparent element.

Preferably, the monitor diodes may be arranged on a carrier that preferably includes ceramics or is made of ceramics, and the normal direction of the surface of the carrier on which the monitor diodes are arranged may be inclined relative to the main emission direction of at least one of the lasers, with an inclination relative to the main emission direction in an angular range from 3° to 15°, preferably from 5° to 10°, most preferably from 6° to 8°. As a result, light emerging from the rear side of the laser is very effectively reflected by the monitor diodes such that it does not reenter any one of the lasers, and consequently no undesired optical interactions will occur, such as mode coupling of resonator modes of the respective lasers.

In a further preferred embodiment of the present invention, the normal direction of at least that wall of the housing cap on which the transparent element is arranged is inclined relative to the main emission direction of at least one of the lasers, with an inclination relative to the main emission direction in an angular range from 3° to 15°, preferably from 5° to 10°, most preferably from 6° to 8°. As a result, light emerging from the front side of the laser is very effectively reflected by the surfaces of the transparent element in such a way that it does not re-enter any one of the lasers, and consequently no undesired optical interactions will occur, such as coupling of the resonator modes of the respective lasers.

In an alternative embodiment of the present invention, the housing cap may have a plurality of openings, and each of these openings may have a respective transparent element associated therewith, or all of these openings may share one common transparent element associated therewith.

In a further advantageous embodiment of the present invention, the housing cap has a plurality of openings, with a respective transparent element arranged on each one of the openings. The transparent element being in the form of a beam-shaping optical element selected from the group of optical elements consisting of: spherical plano-convex and concavo-convex lenses, spherical lenses, hemispherical lenses, aspherical plano-convex and concavo-convex lenses.

This allows the multi-laser arrangement to be integrated into external optical systems in a very compact way, and, due to its precise dimensions. The arrangement can optionally even be optically pre-adjusted, meaning that it can already be adjusted in terms of the axial and lateral position of the optical elements. Optionally, in this case, the base plate of the multi-laser arrangement can be inserted into a preformed, precisely positioned recess of the further optical system and already accommodated in an adjusted way relative to the further optical system through this positioning. Furthermore, as the base plate is in contact with the further optical system, heat can be dissipated in a defined manner from the multi-laser arrangement and additional deheating of the lasers of the multi-laser arrangement can be achieved through the further optical system.

If an optical fiber is connected to the housing, in particular to the housing cap, preferably via a fiber connector, in particular a releasably mateable fiber connector or a permanently mateable fiber connector, this creates further structural freedom, because this allows the multi-laser arrangement to be arranged spaced apart from a further optical system, for example, as will be illustrated in more detail further below, for the further optical system provided by AR glasses, merely by way of an example.

If each laser of the multi-laser arrangement has an optical fiber associated therewith and the fibers associated with the lasers are combined into a fiber bundle, in which they are preferably packed close to one another with their respective fiber cores, and preferably share a common fiber cladding surrounding the fiber cores, this will further contribute to a structural compaction of a system made up of a multi-laser arrangement and a further optical system. If, in his case, the optical fibers are arranged next to one another in a plane corresponding to the direction of the lines of an associated imaging device, for example, and with a further associated optical device with line-by-line image build-up, for example, a white color impression will already be perceived by the human eye. This perception being due to the superimposition, in the line direction, of the light components of the first laser emitting in the red spectral range of the visible spectrum and of the second laser emitting in the green spectral range of the visible spectrum and of the third laser emitting in the blue spectral range of the visible spectrum, if these respective color components are superimposed in the respective line quickly enough so that a color change is no longer resolved by the human eye. Consequently, a fiber splicing process, possibly involving an extension in length, can be dispensed with, and the respective fiber of this embodiment can be made very short.

In the context of the present disclosure, each of the terms "fiber", "optical fiber", and "light-guiding" fiber are used for a fiber that is suitable for guiding the light of the lasers emitting in blue, green, and red throughout the entire spectral range emitted by the lasers from the entry end to the exit end thereof with low losses. Such fibers are known to a person skilled in the art and require no further explanation.

The multi-laser arrangement may advantageously have glass-metal feedthroughs for connection lines to the lasers and/or to the monitor diodes.

If the monitor diodes each have color filters, in particular color filters in the form of bandpass filters for the emission wavelength of the respectively associated laser, the light from the respective further lasers can be suppressed and a better signal-to-interference signal ratio or a better signal-to-noise ratio can be obtained for the sensory signals of the monitor diodes.

If the base plate of the housing is designed as a reference potential and is current-carrying, this simplifies the electronic wiring of the multi-laser arrangement and provides an operationally safe housing for a user.

In a further advantageous embodiment of the present invention, the base plate may serve as a carrier for optical assemblies and may structurally protrude from below the housing cap.

For suppressing scattered light, the inner surface of the housing cap may be blackened, in particular blackened with a matt finish, using a paint or a coating, such as a black chrome coating or a zinc-nickel coating, in particular also an electrolytic coating. In this way, such a coated surface is able to absorb 98% and more of the light incident on this surface in the spectral range of the light emitted by the lasers.

The housing may advantageously include protective means for the glass of the transparent element, in particular in the form of a portion laterally protruding beyond the transparent element.

A multi-laser arrangement, attractive in terms of its size, can be provided for various especially mobile applications if the housing has housing dimensions with, for example, a height, in particular in the X direction, from 1.0 mm to 3.5 mm, and/or a width, in particular in the Y direction, from 4 mm to 10 mm, and/or a length, in particular in the Z direction, from 4 to 10 mm.

The aforementioned directions, in particular the respective X, Y, and Z directions, will be explained in more detail in the context with the following detailed description, in particular with reference to the Cartesian coordinate system as illustrated in FIG. 4.

Such mobile applications may, for example, relate to AR glasses or spectacles that include such a multi-laser arrangement, and also to a head-up display, for example for helmet visors, for example of a protective helmet, such as a motorcycle helmet, or a helmet for police or security forces, or for avionics devices or equipment.

Projectors can also benefit from the presently disclosed multi-laser arrangement and its very small dimensions, in particular when used in mobile devices.

BRIEF DESCRIPTION OF THE DRAWINGS

The patent or application file contains at least one drawing executed in color. Copies of this patent or patent application publication with color drawings will be provided by the Office upon request and payment of the necessary fee.

The above-mentioned and other features and advantages of this invention, and the manner of attaining them, will become more apparent and the invention will be better understood by reference to the following description of embodiments of the invention taken in conjunction with the accompanying drawings, wherein:

Figure 1:
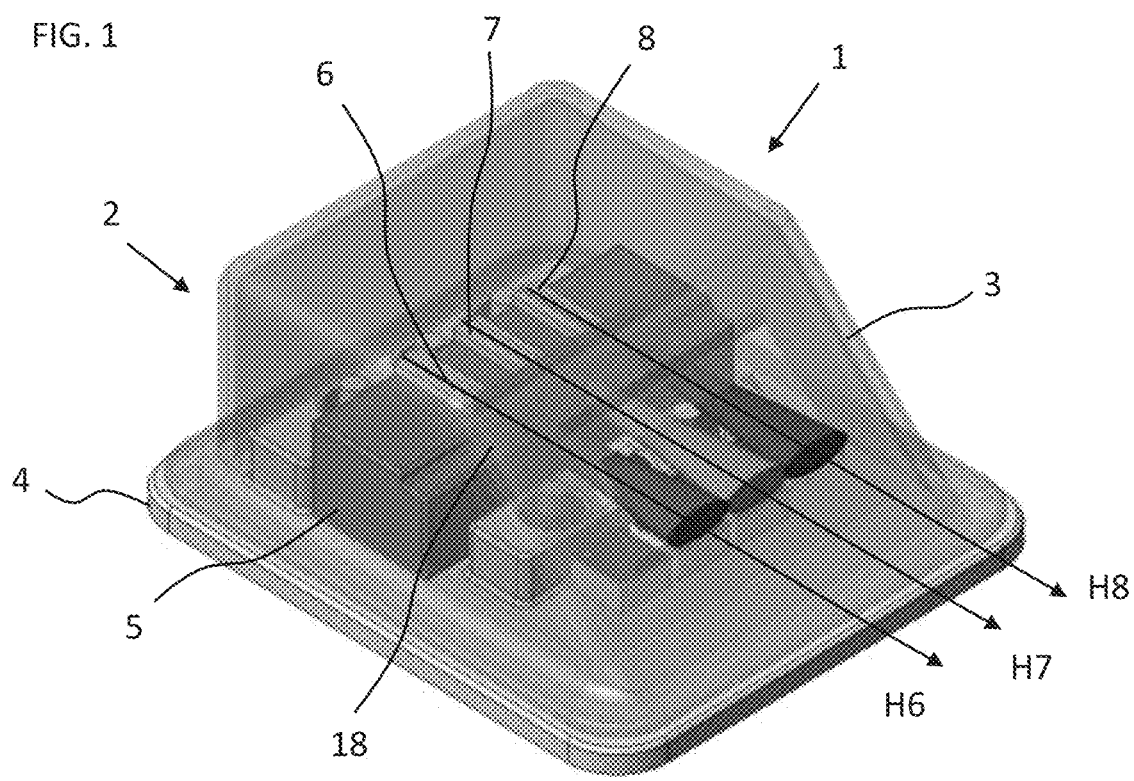
Figure 2:
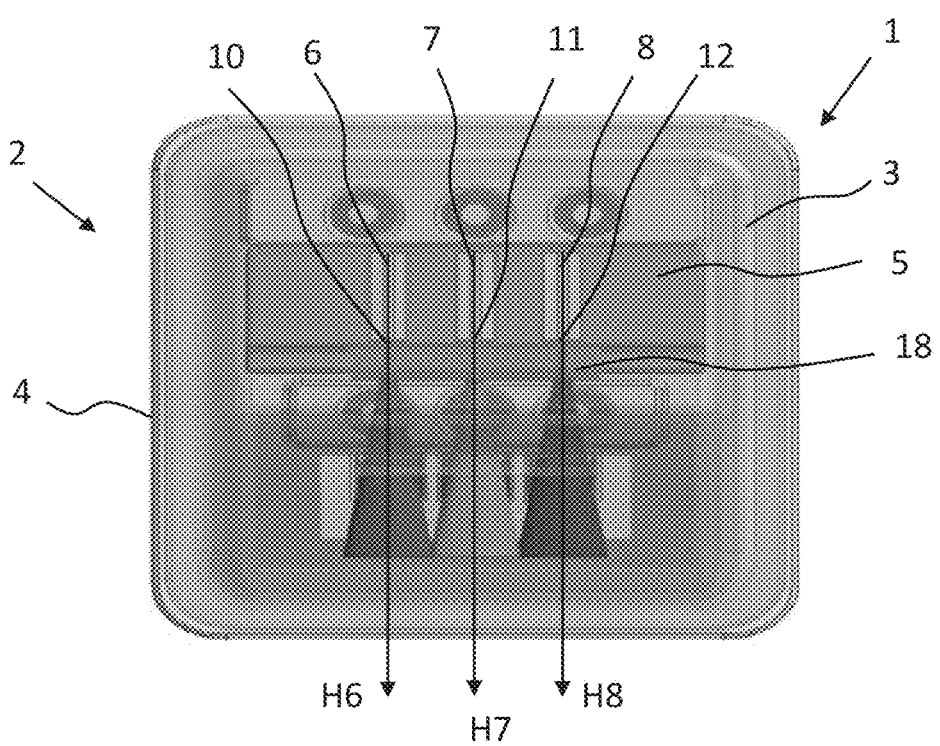
Figure 3:
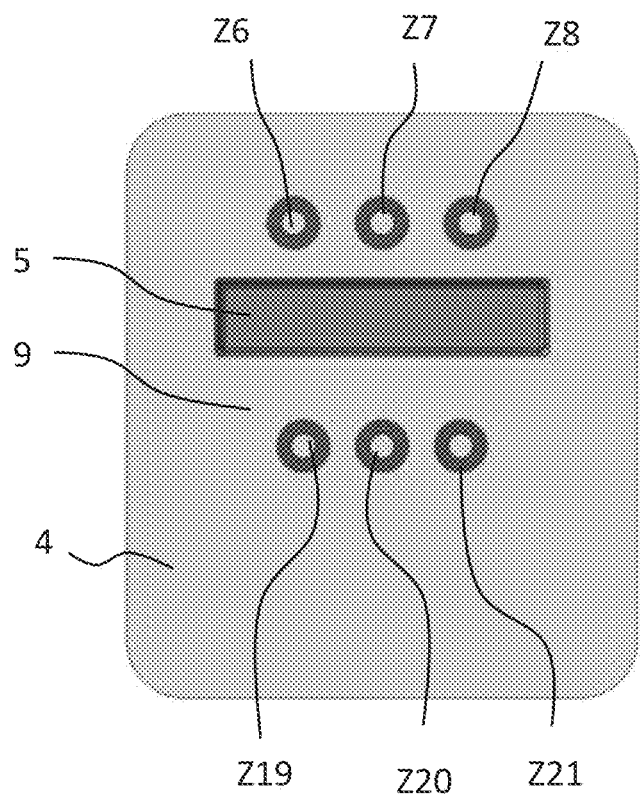
Figure 4:
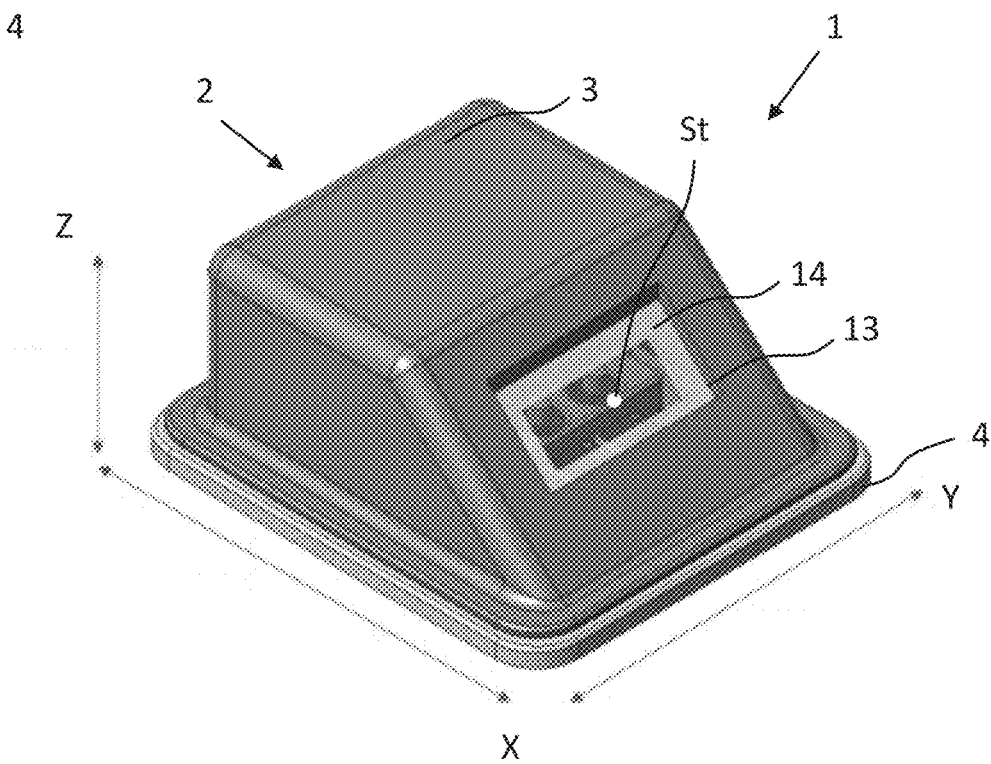
Figure 5:
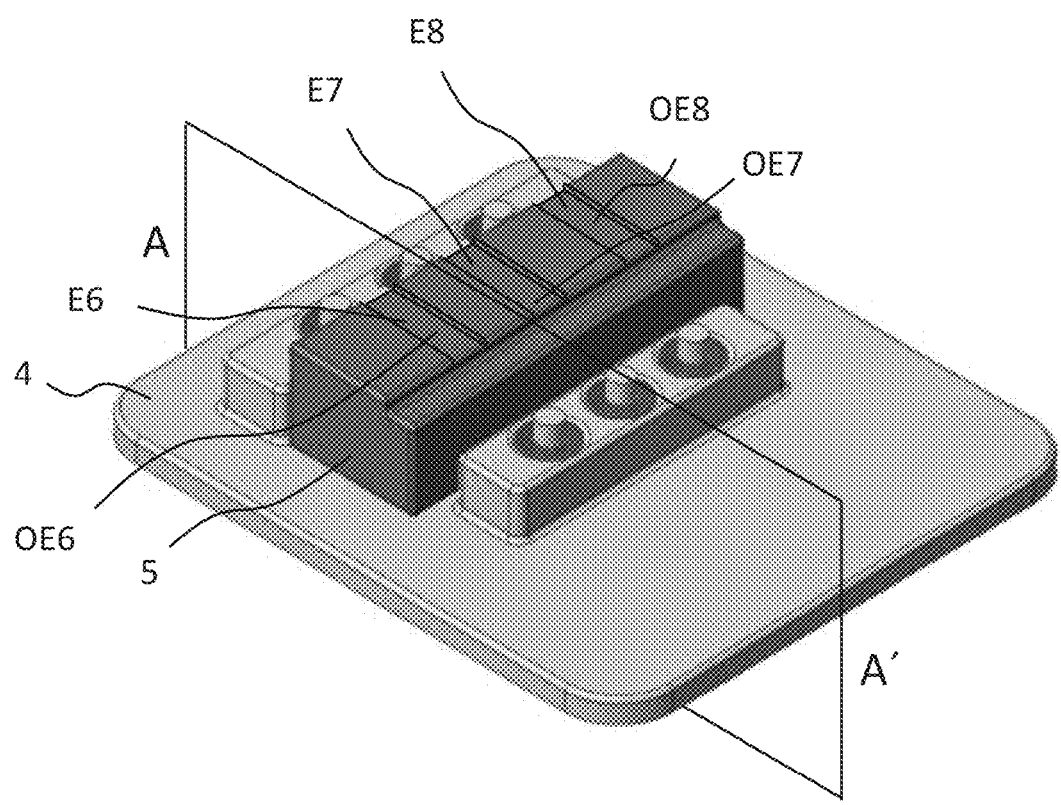
Figure 6:
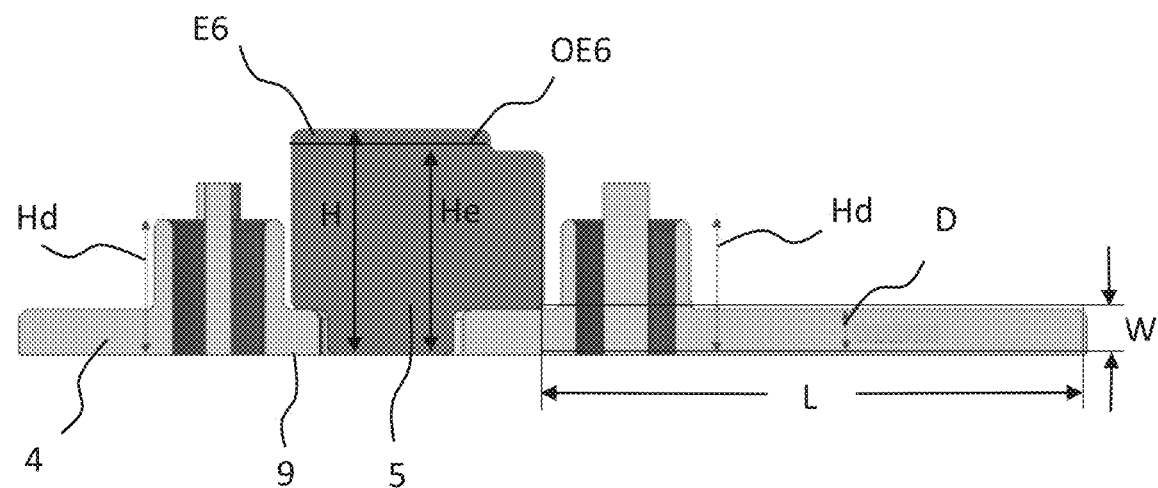
Figure 7:
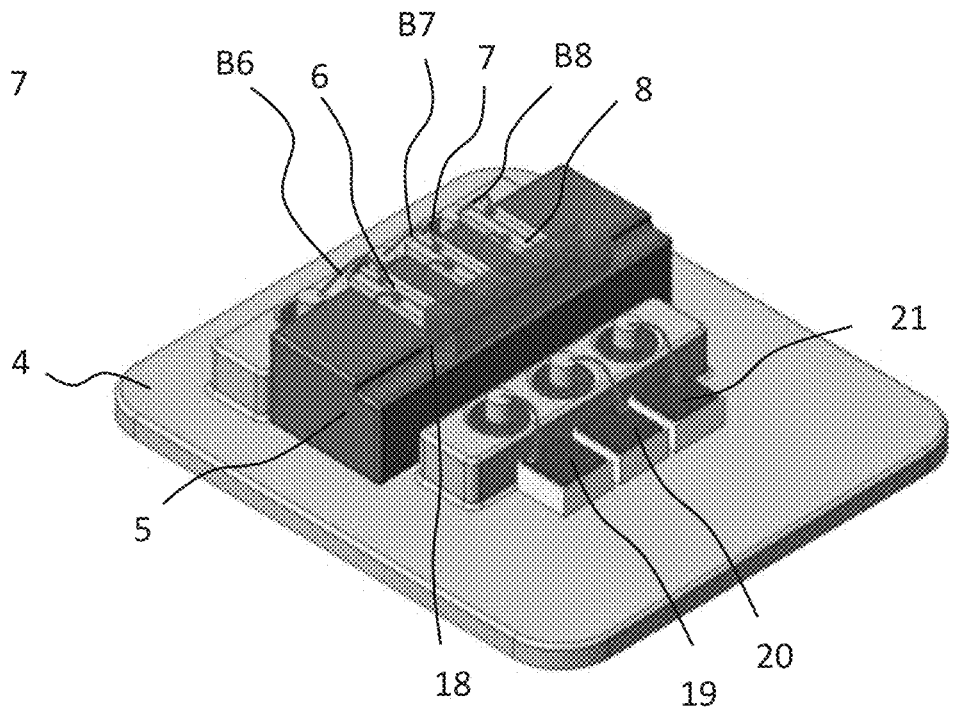
Figure 8:
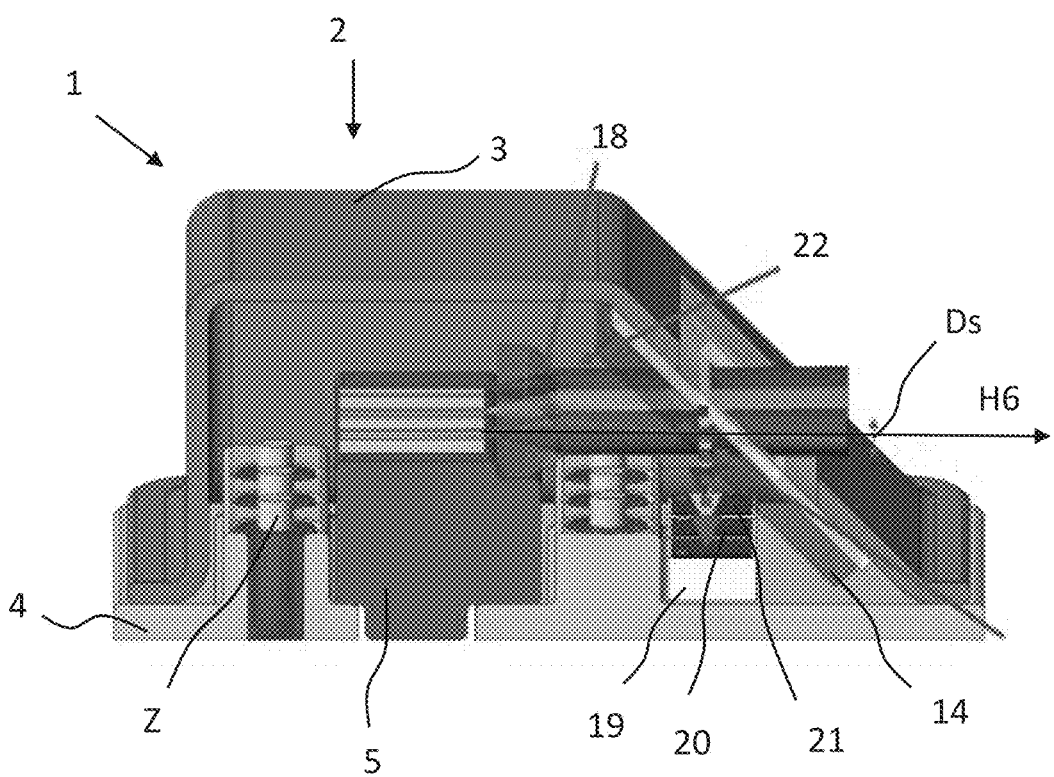
Figure 9:
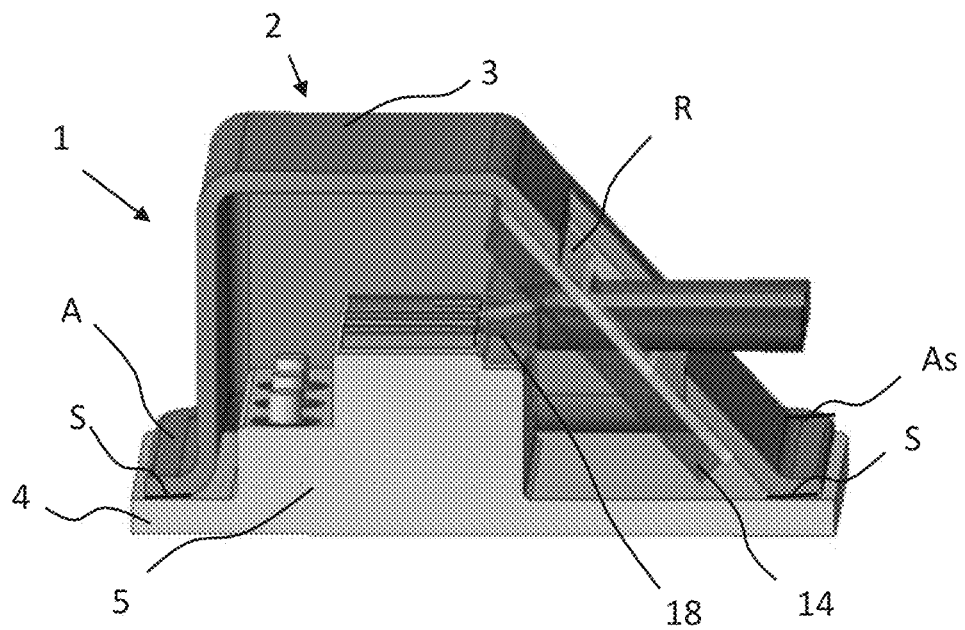
Figure 10:
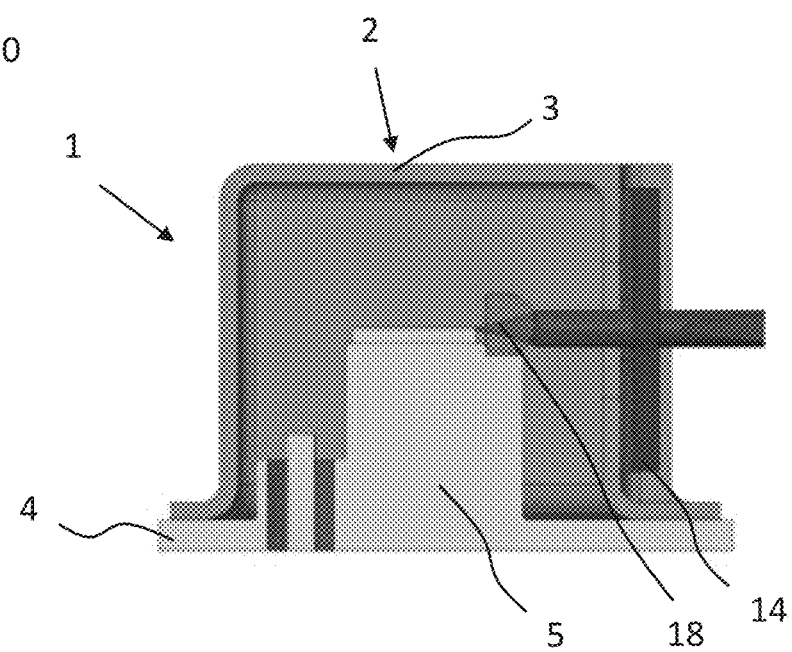
Figure 11:
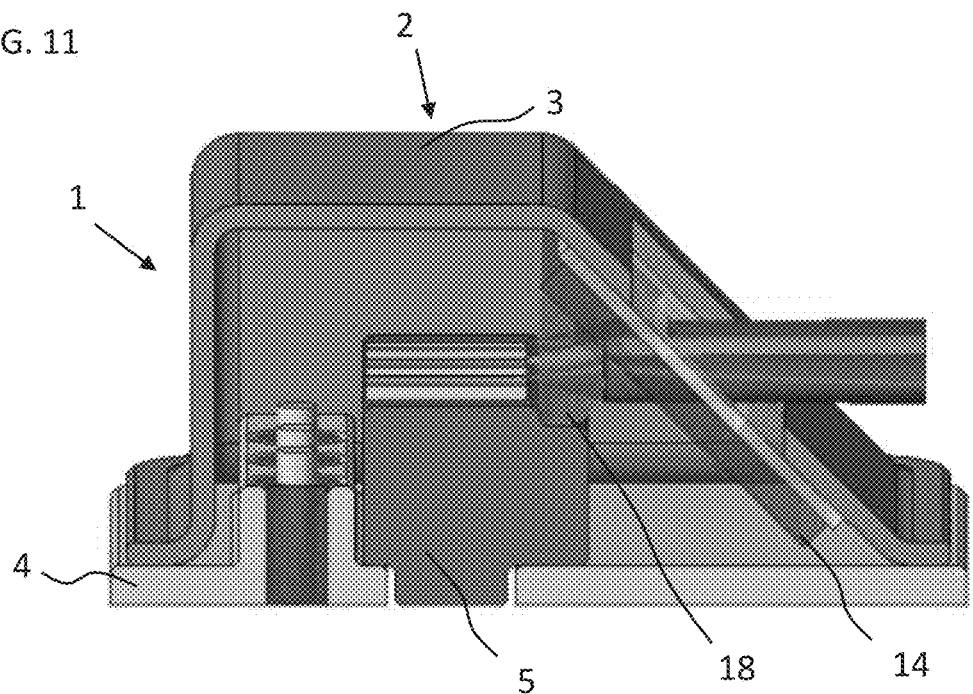
Figure 12:
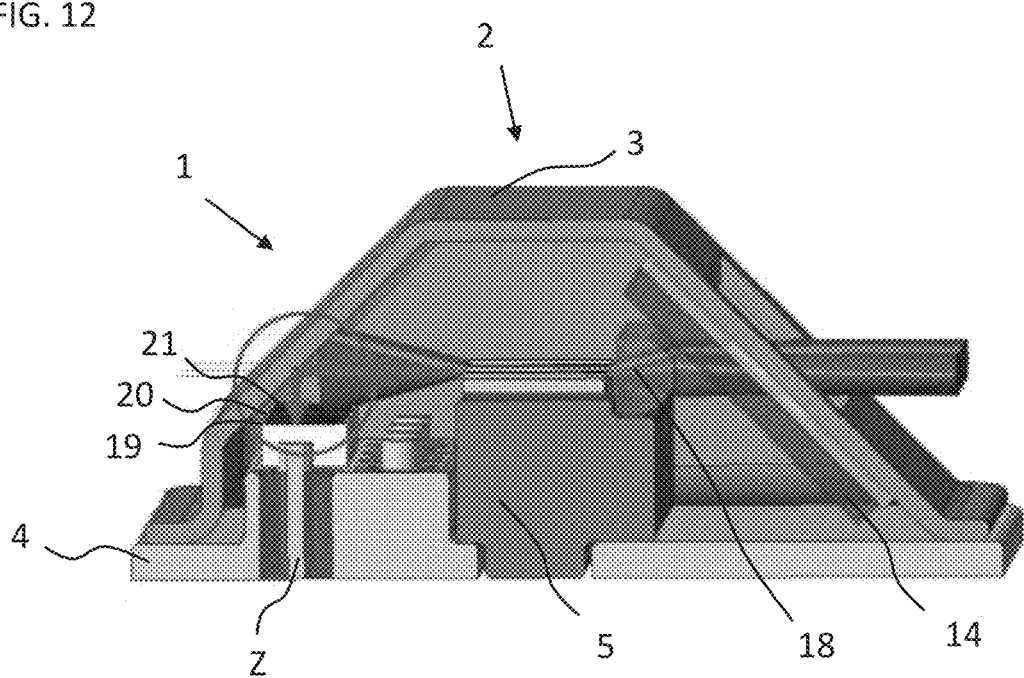
Figure 13:
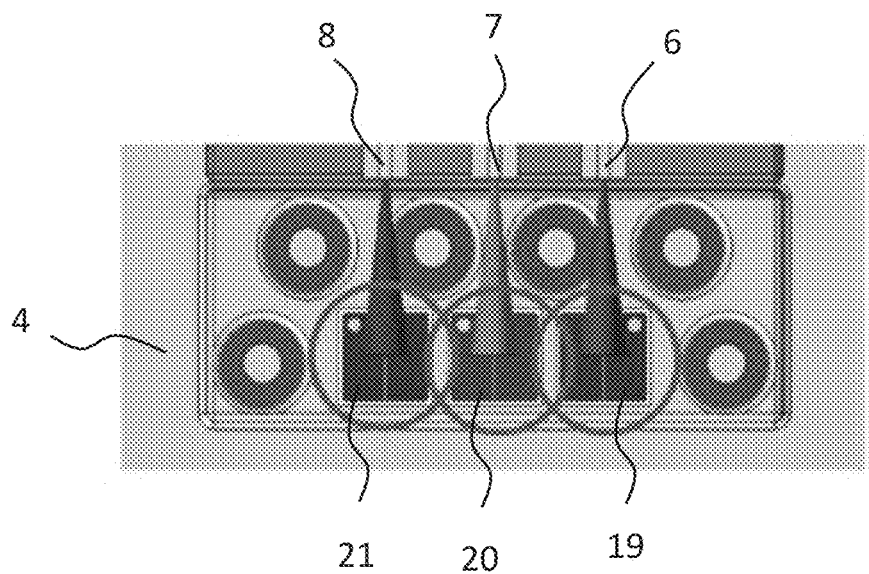
Figure 14:
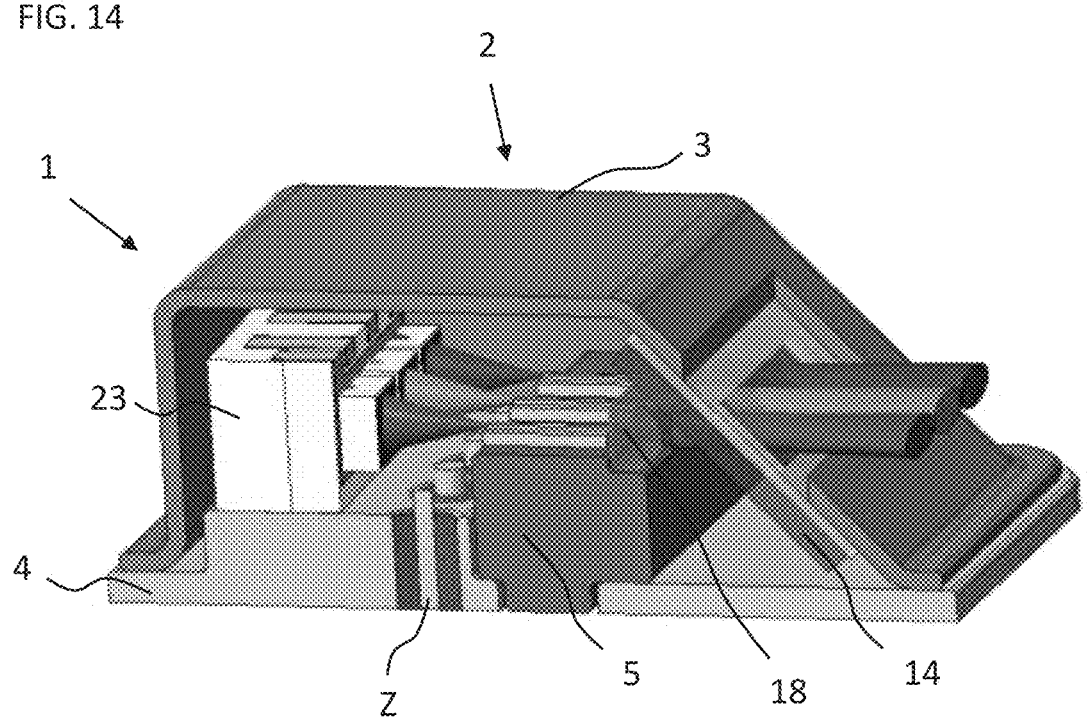
Figure 15:
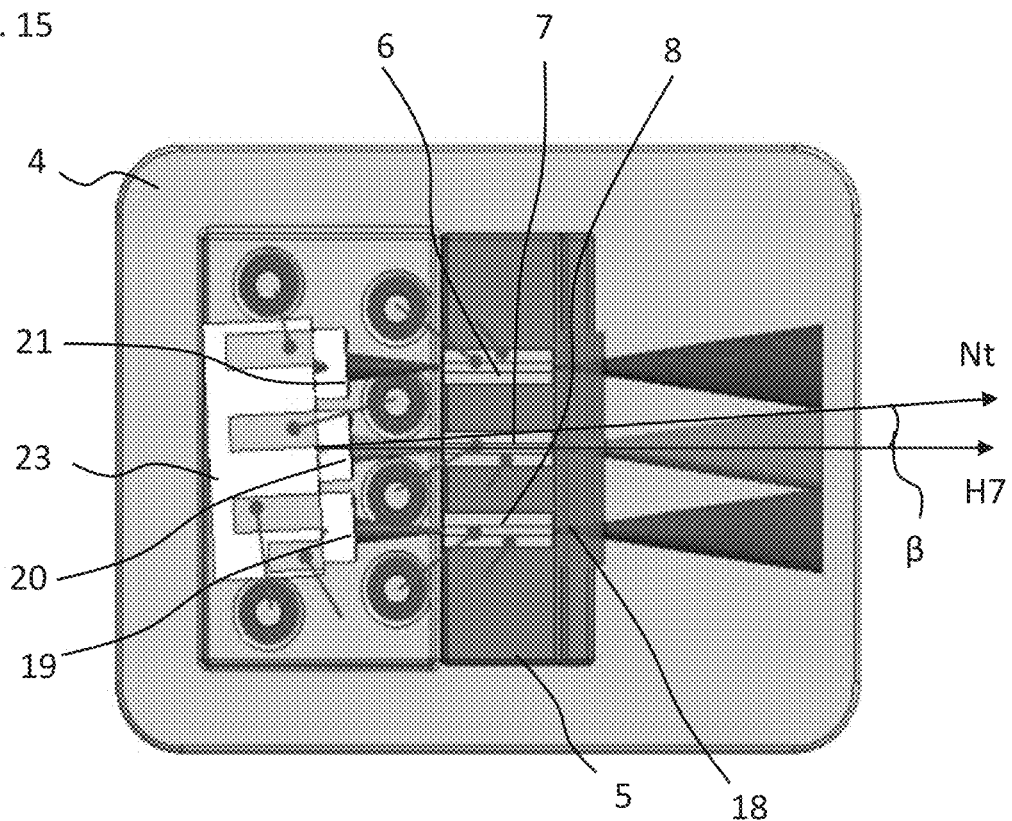
Figure 16:
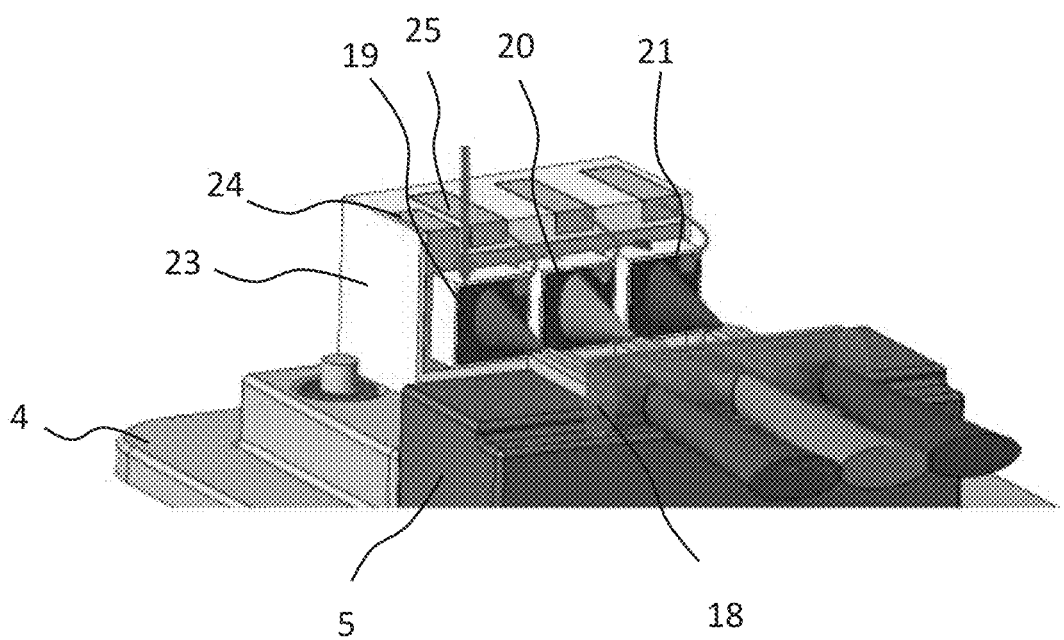
Figure 17:
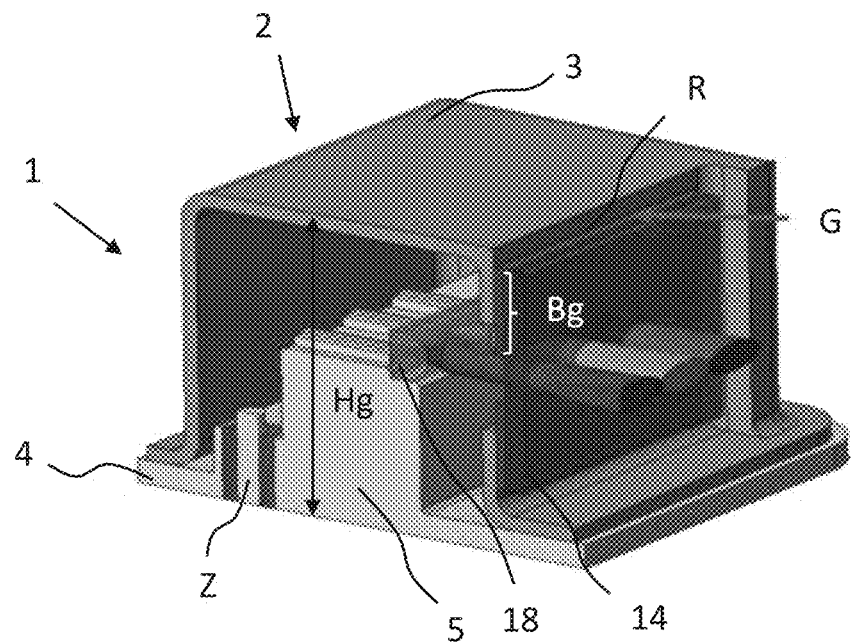
Figure 18:
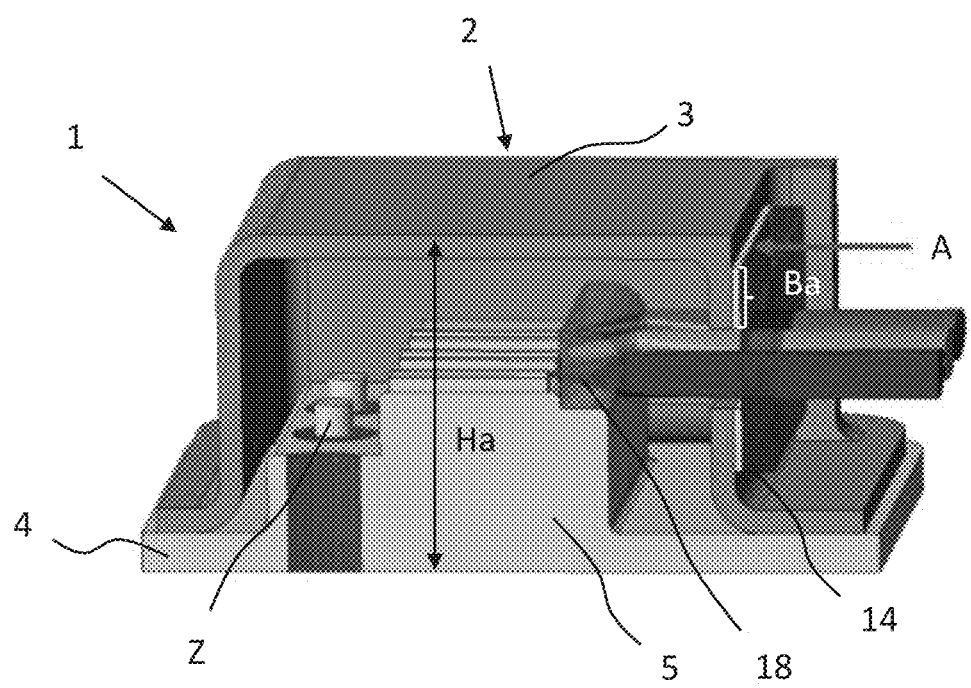
Figure 19:
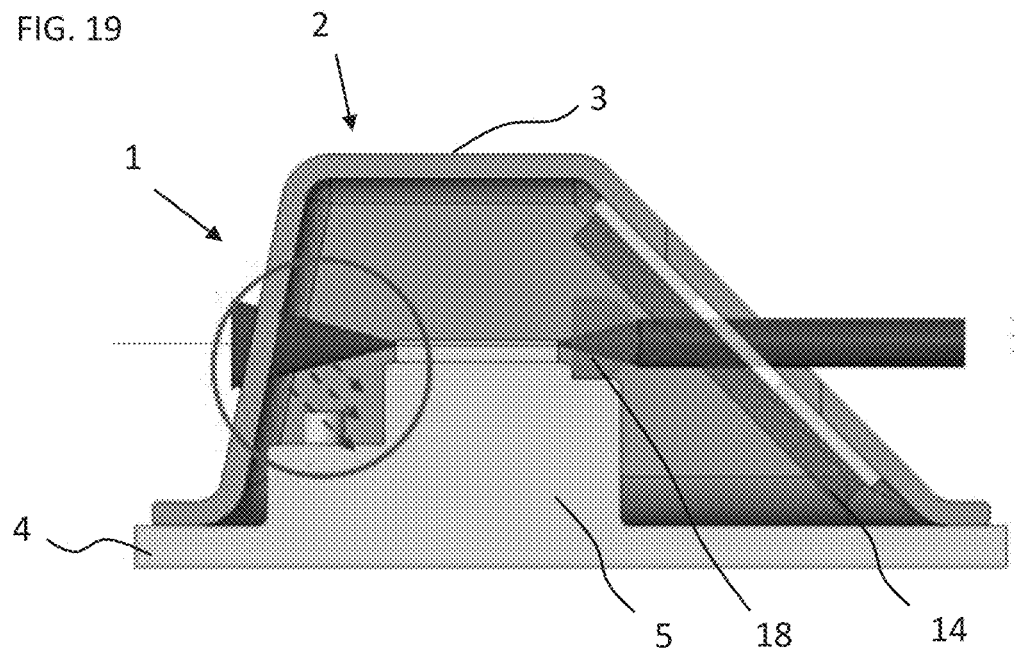
Figure 20:
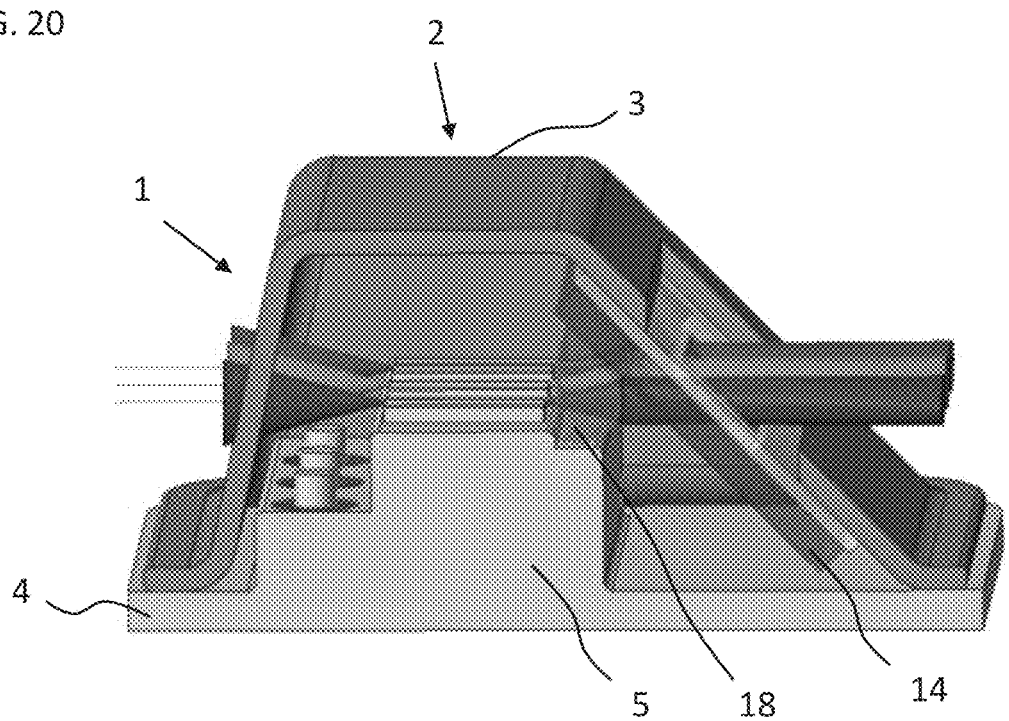
Figure 21:
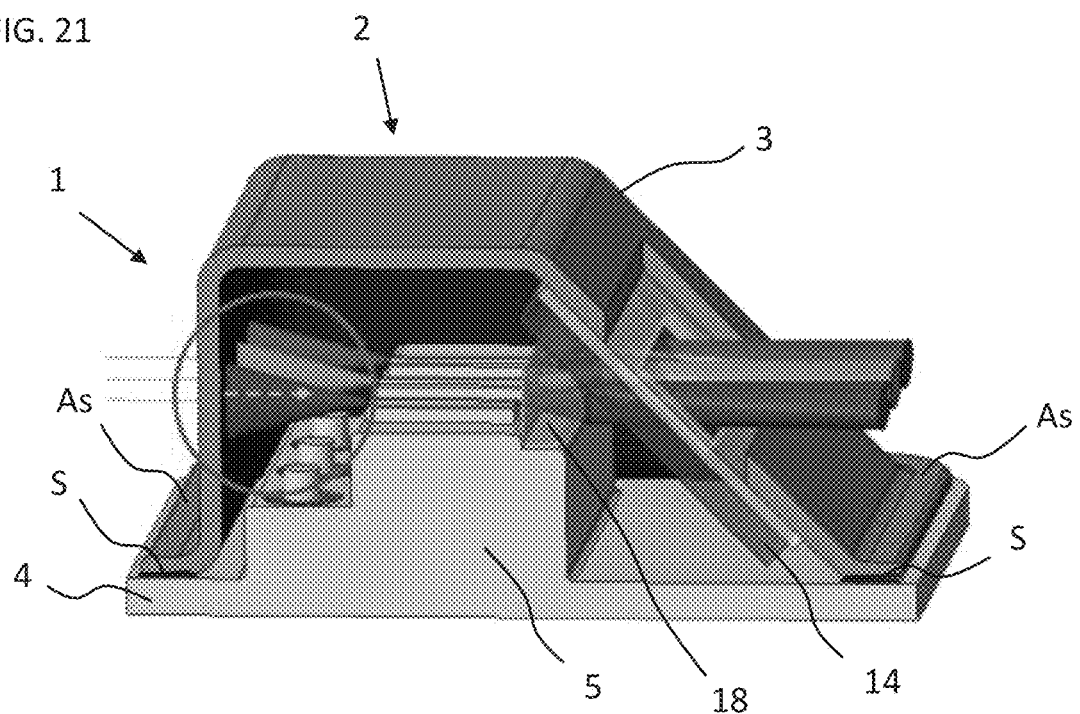
Figure 22:
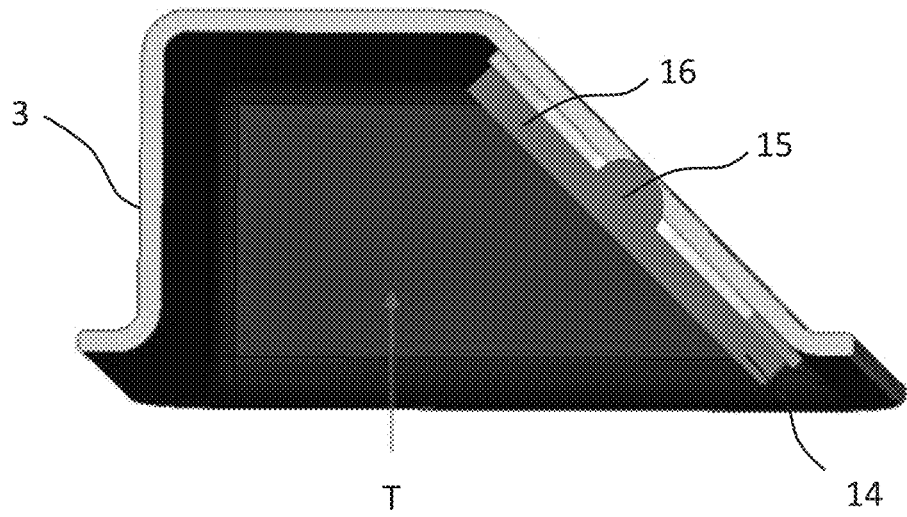
Figure 23:
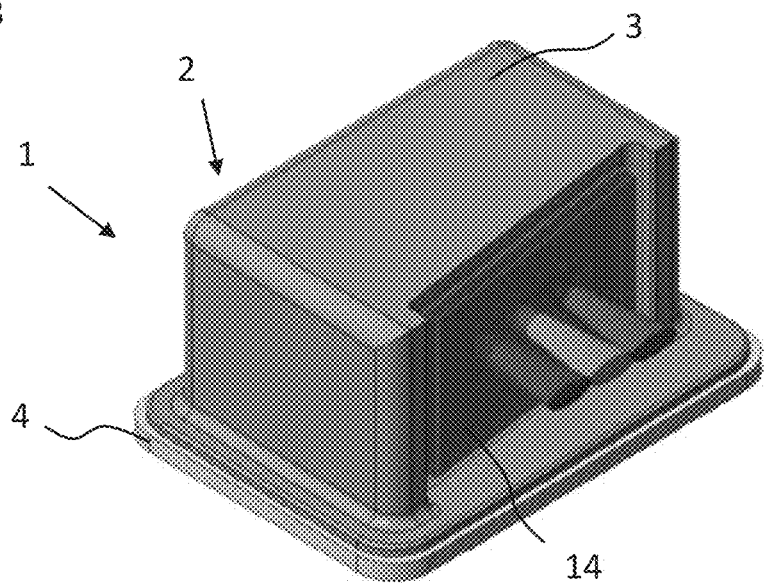
Figure 24:
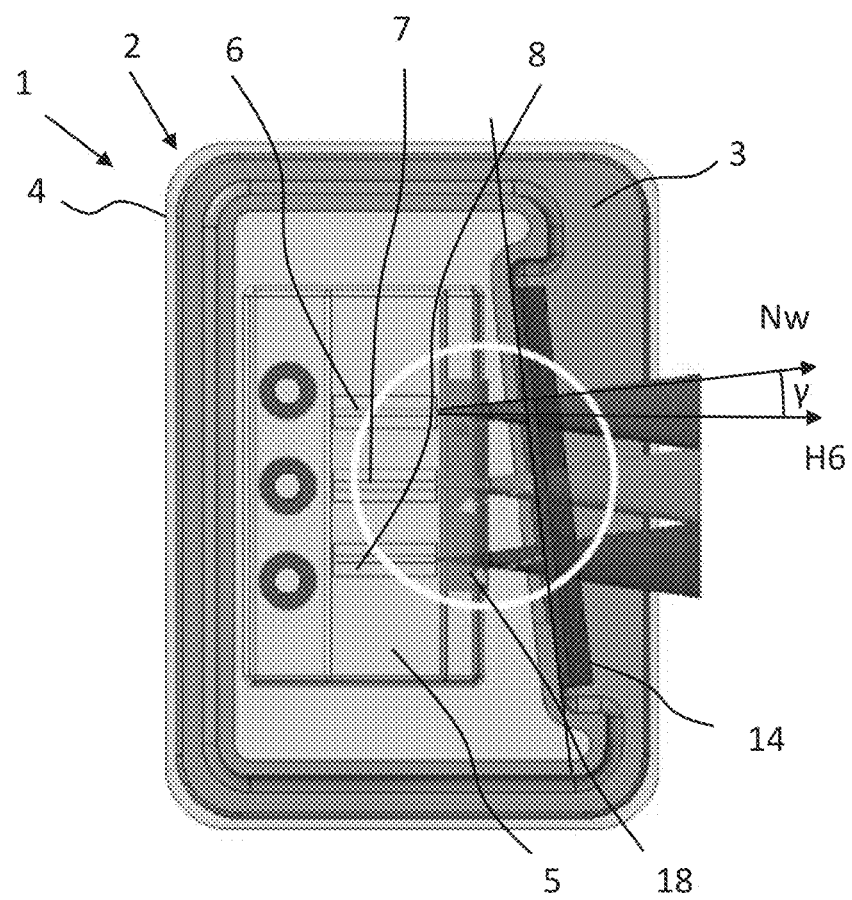
Figure 25:
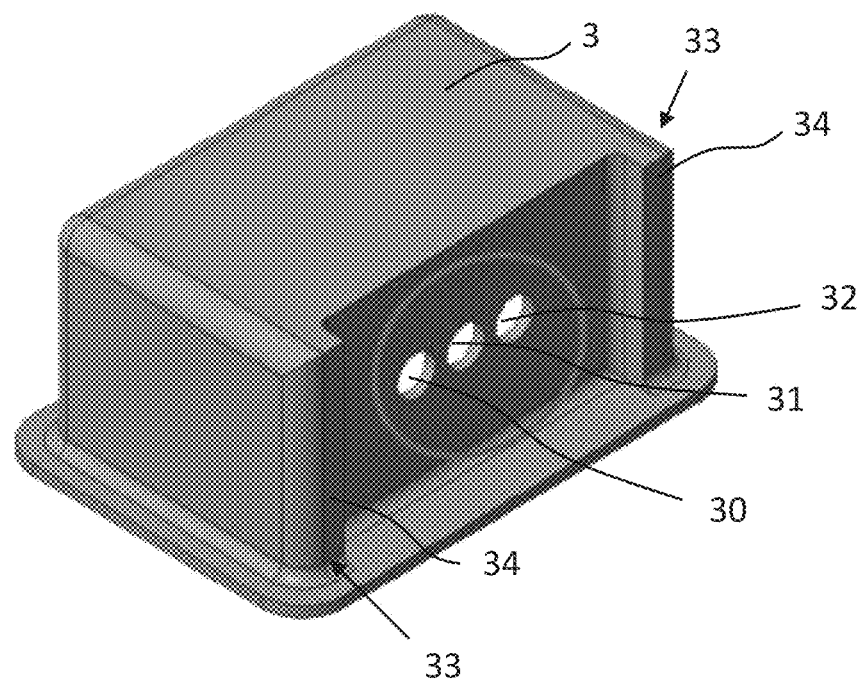
Figure 26:
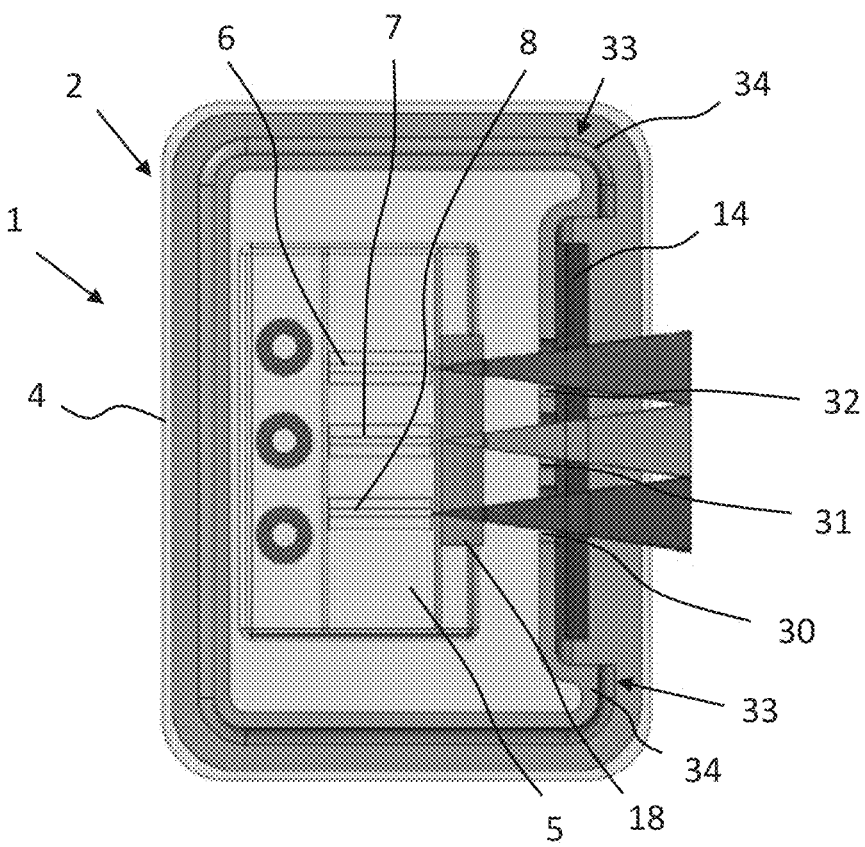
Figure 27:
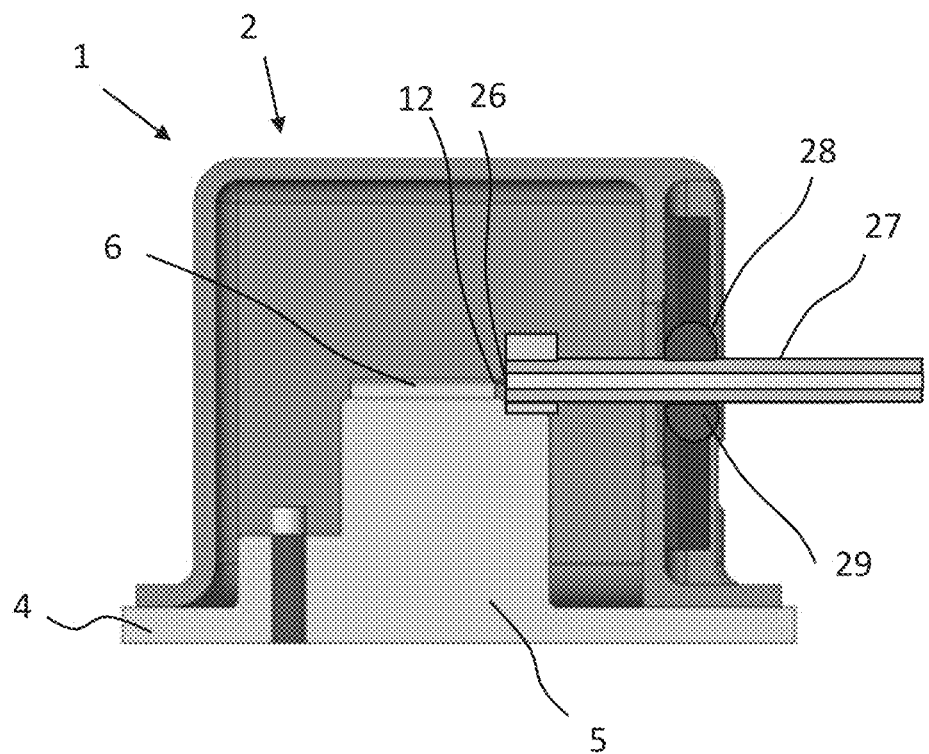
Figure 28:
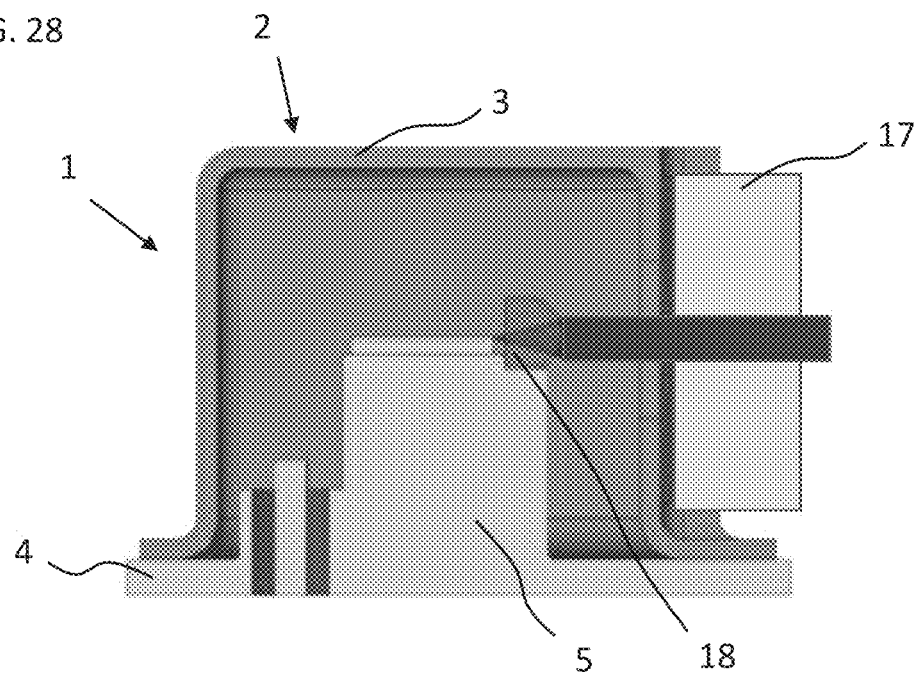
Figure 29:
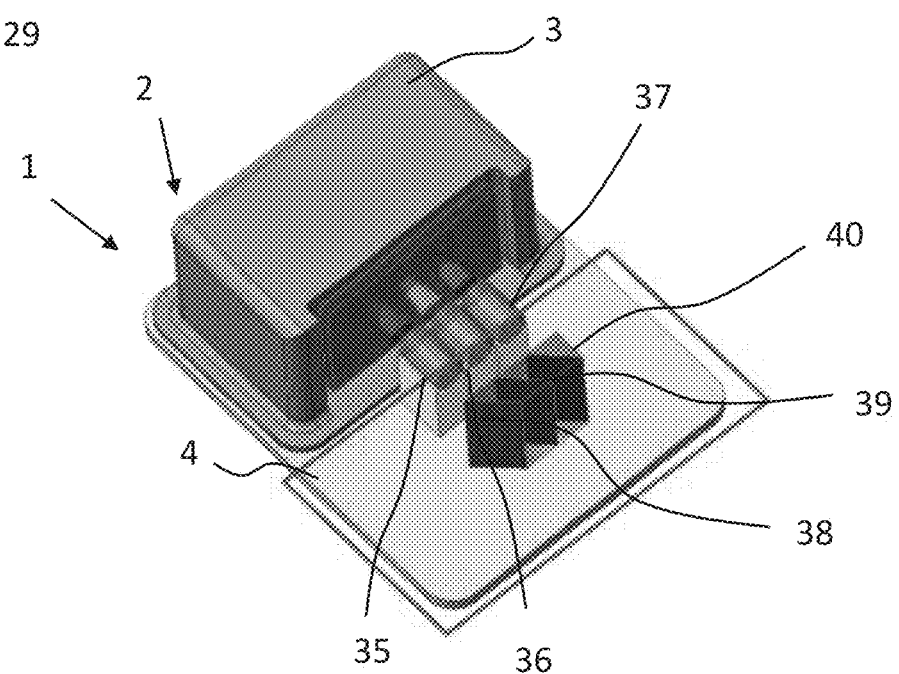
Figure 30:
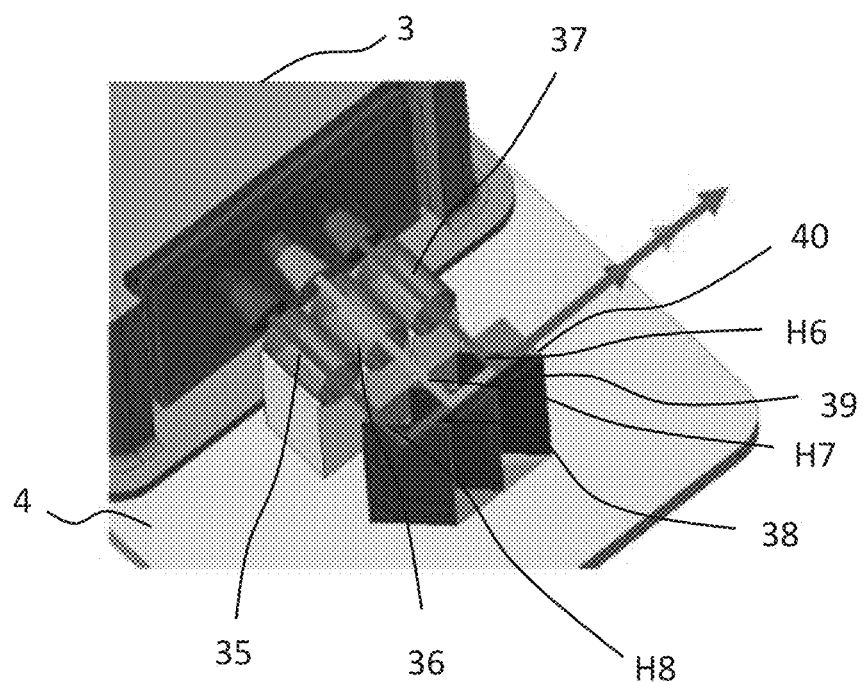
Figure 31:
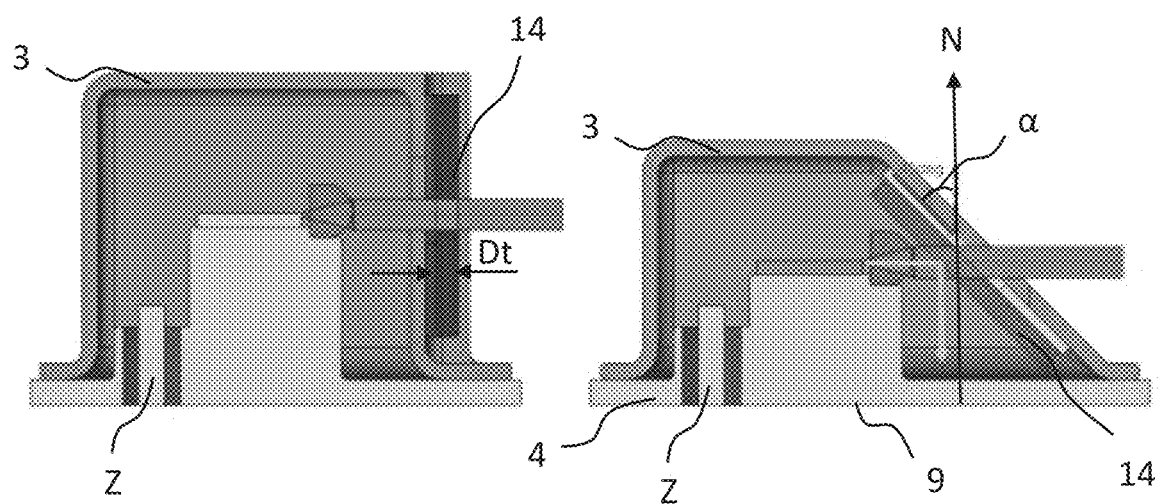
Figure 33:
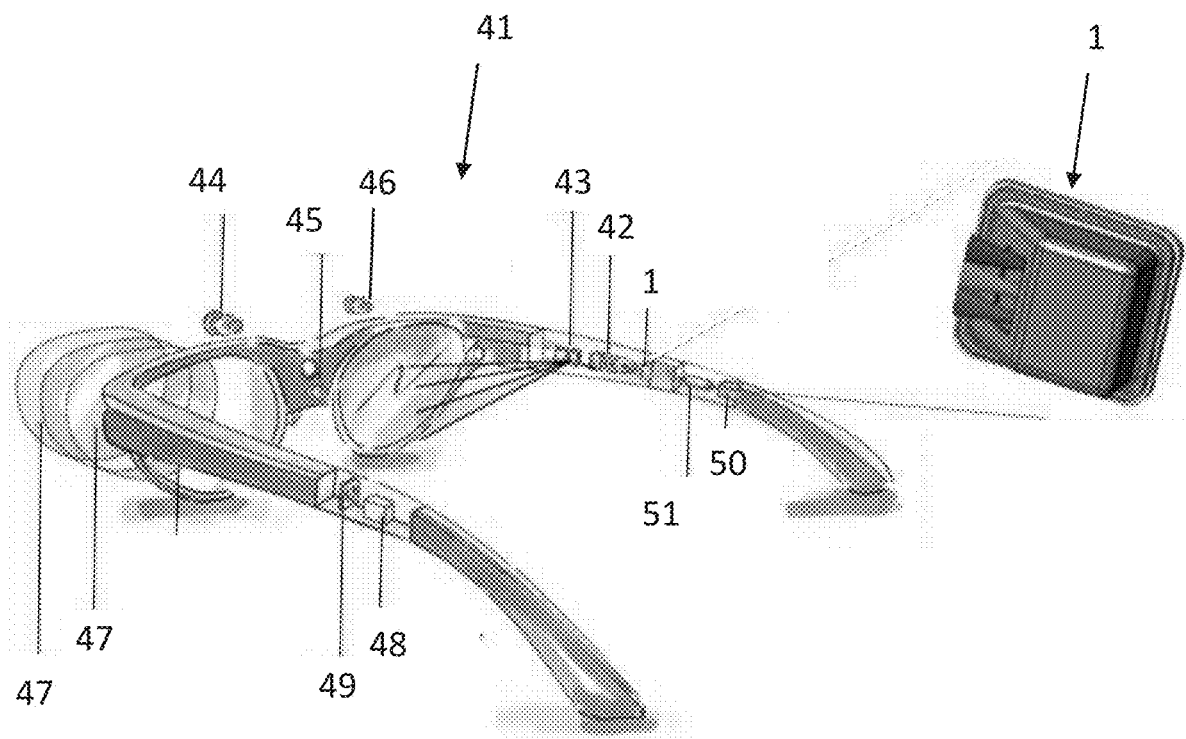
Figure 34:
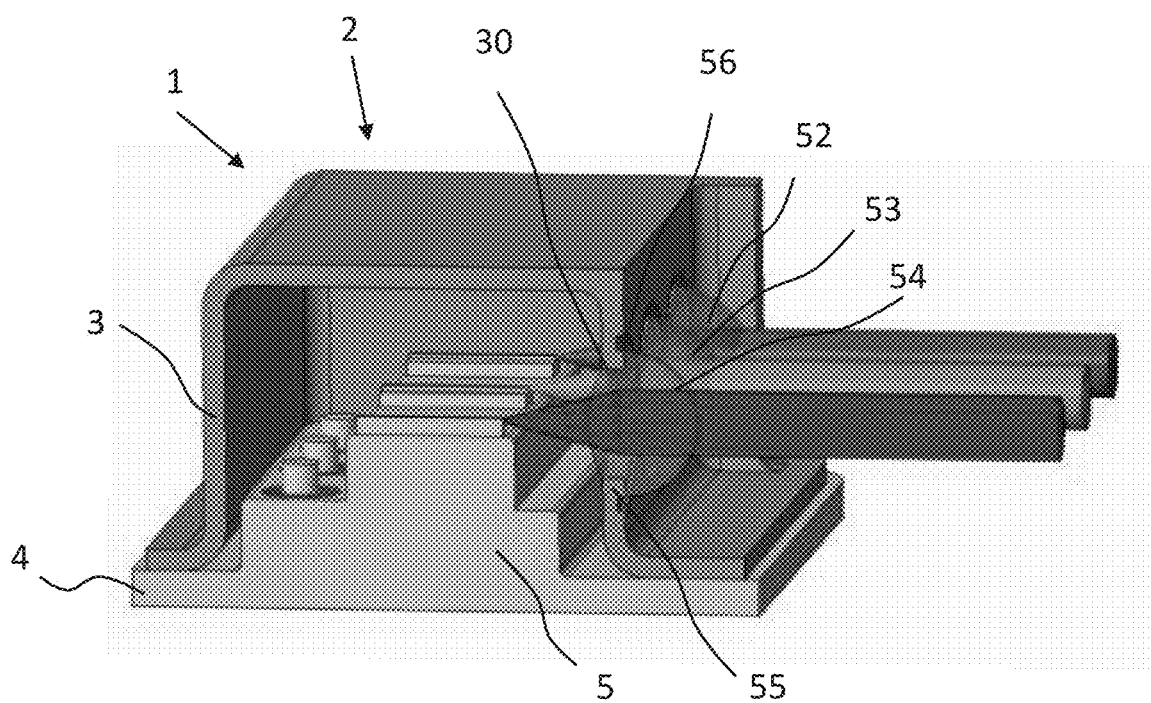
Figure 35:
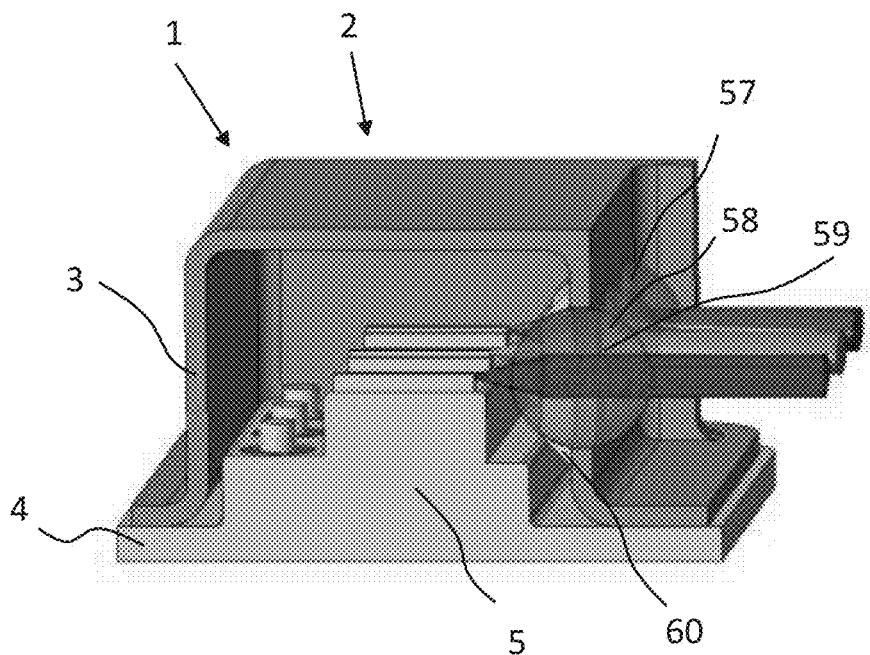
Figure 36:
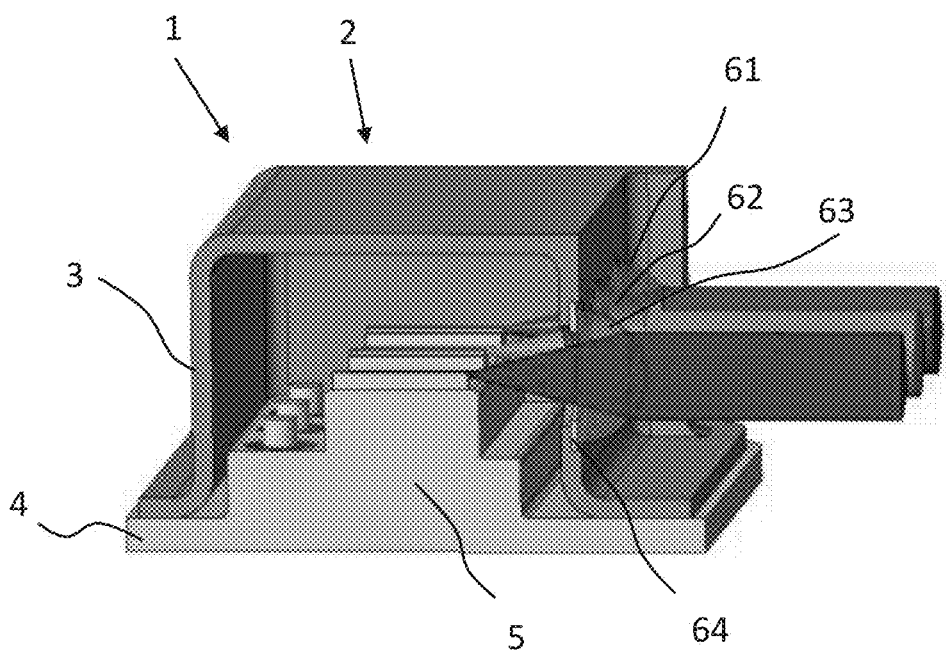
Figure 37:
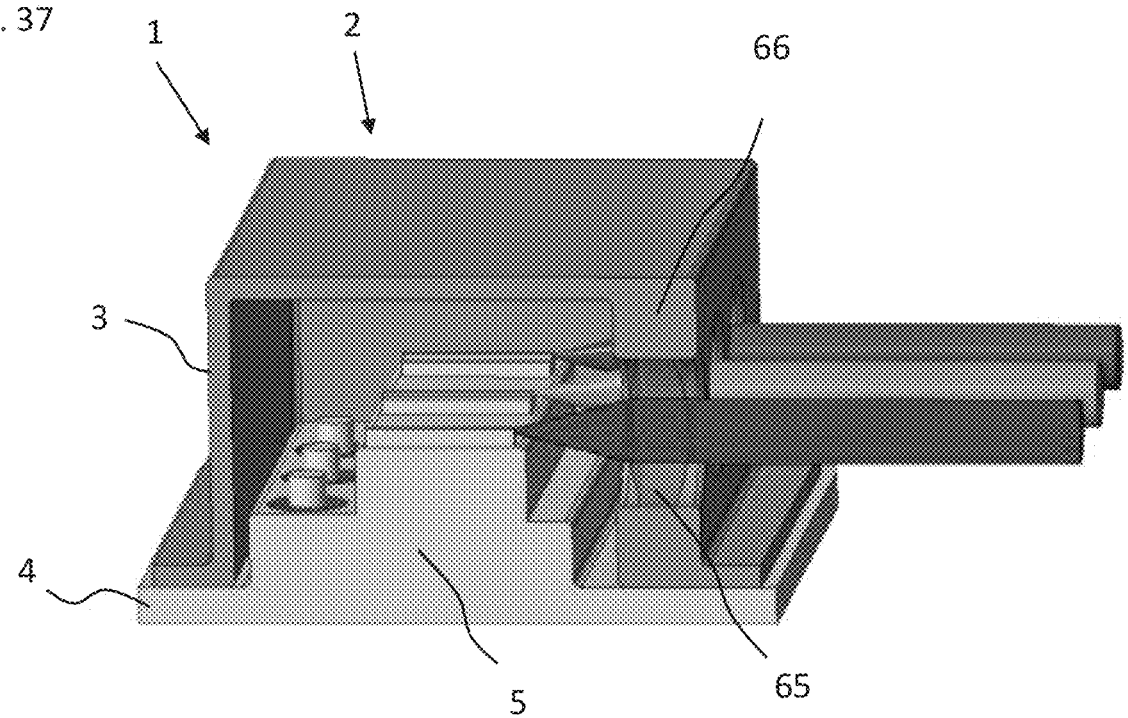
Figure 38:
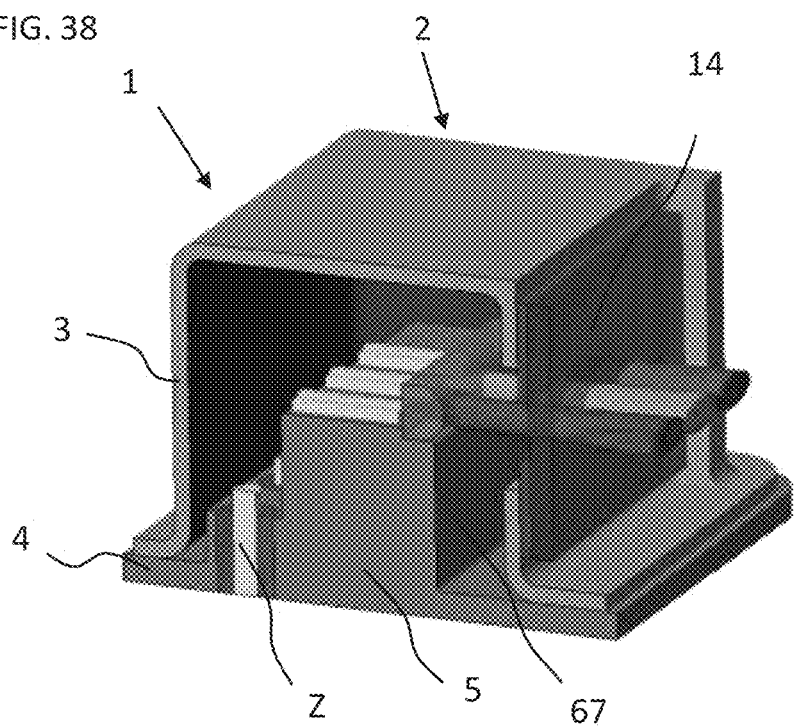
Figure 39:
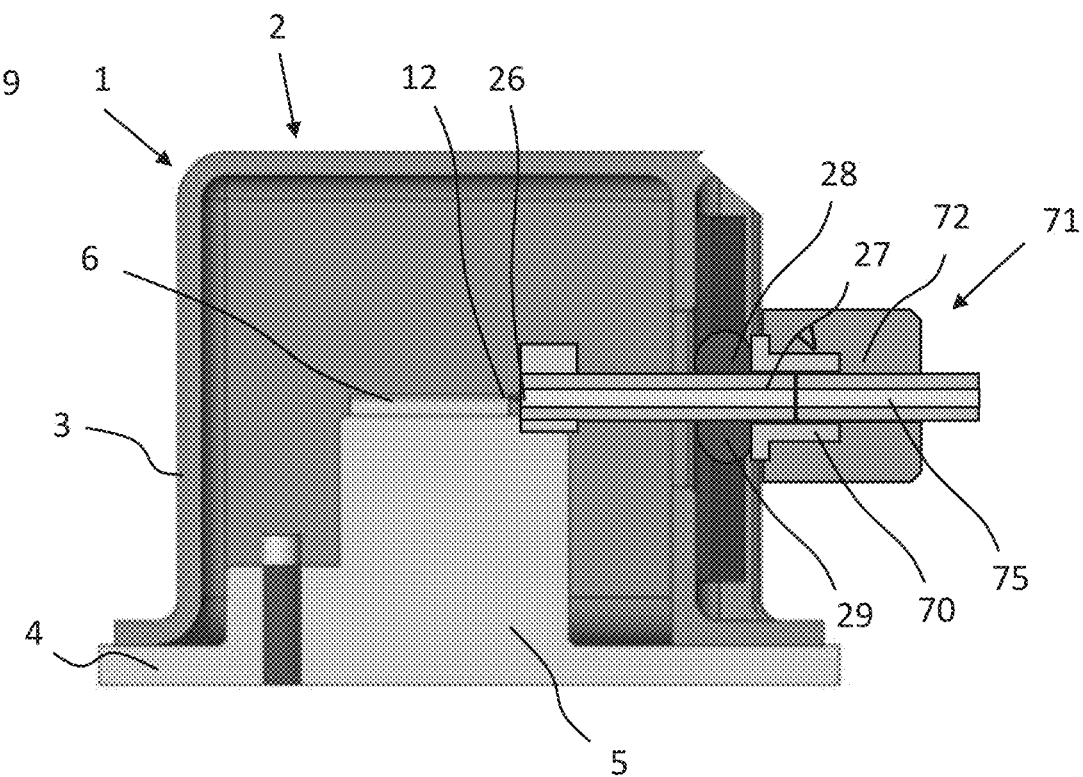
Figure 40:
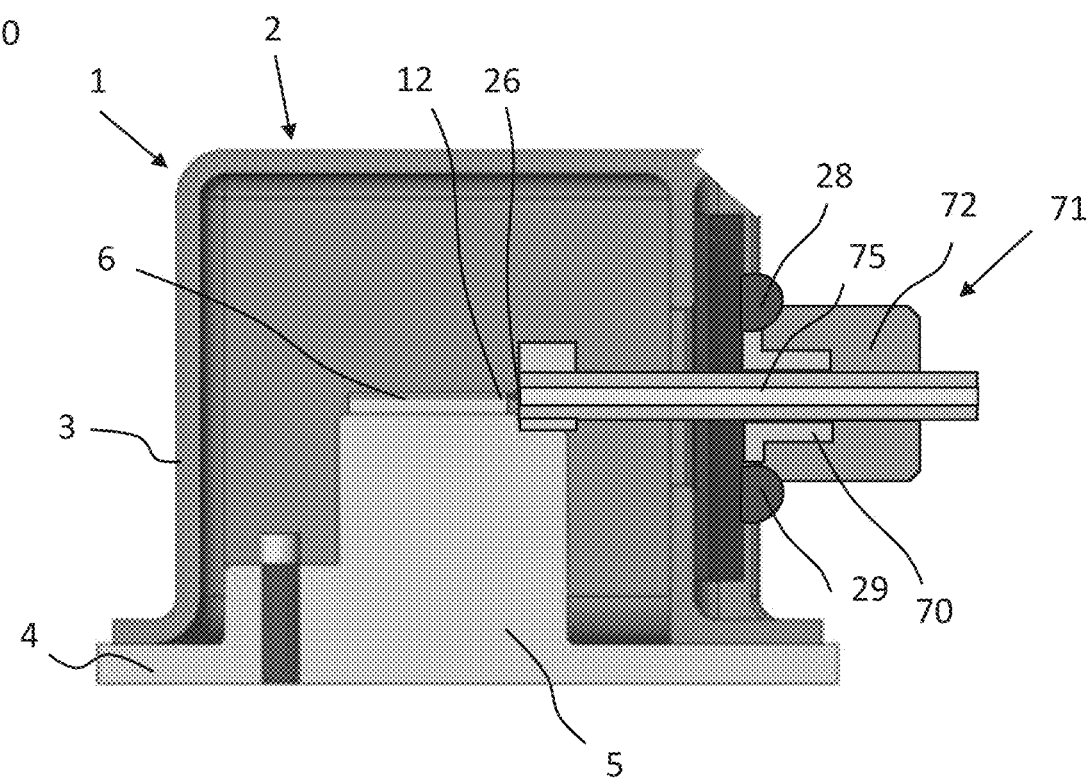
Figure 41:
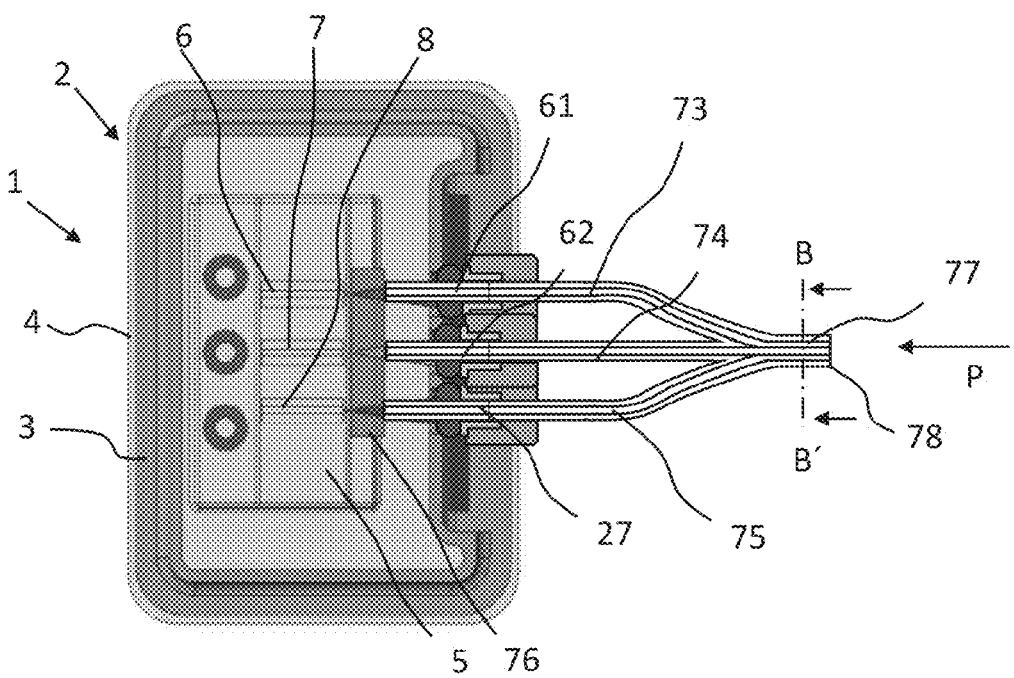
Figure 42A:
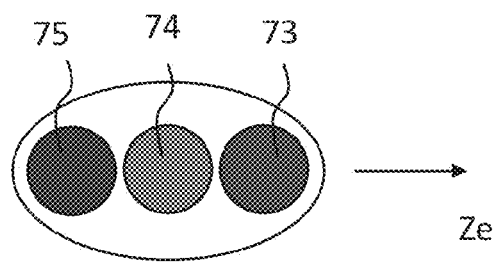
Figure 42B:
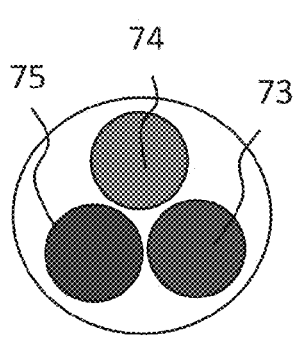
Figure 42C:
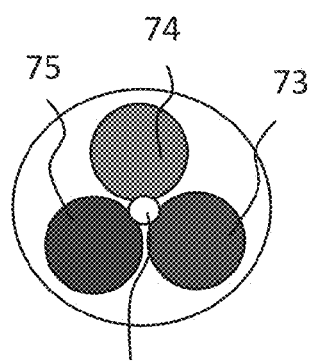
Figure 42D:
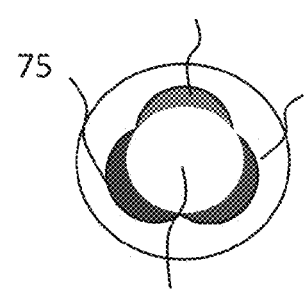
Figure 43:
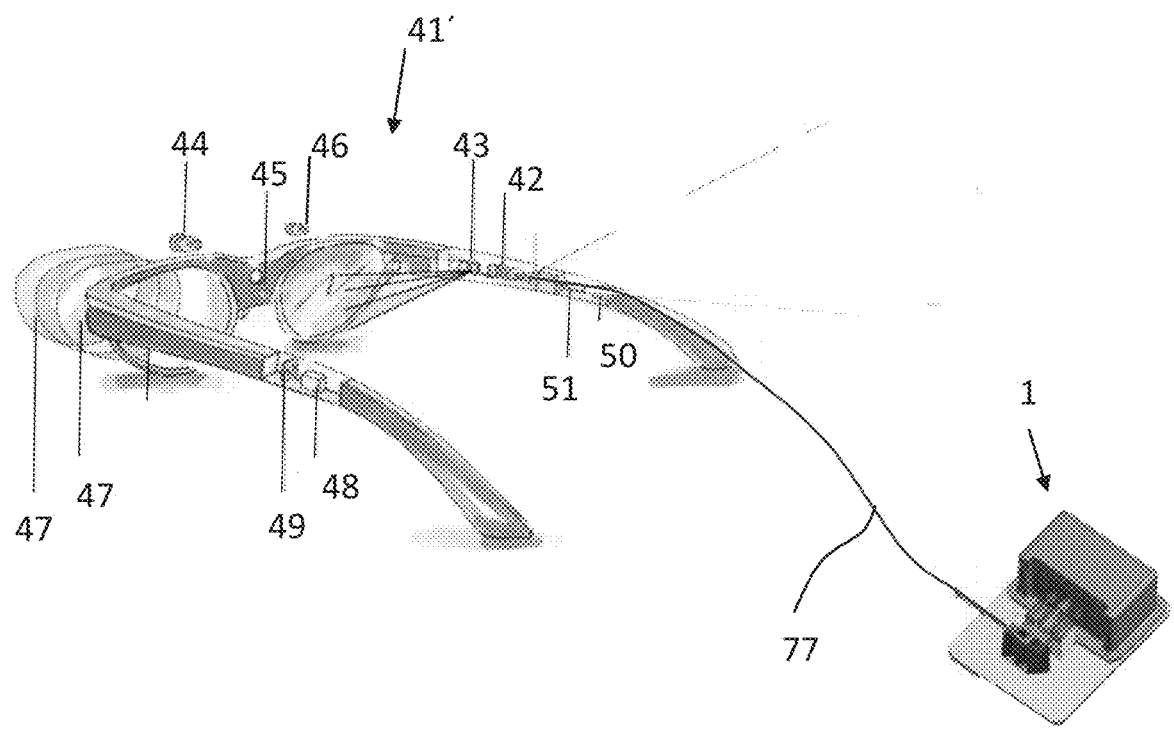
Figure 44:
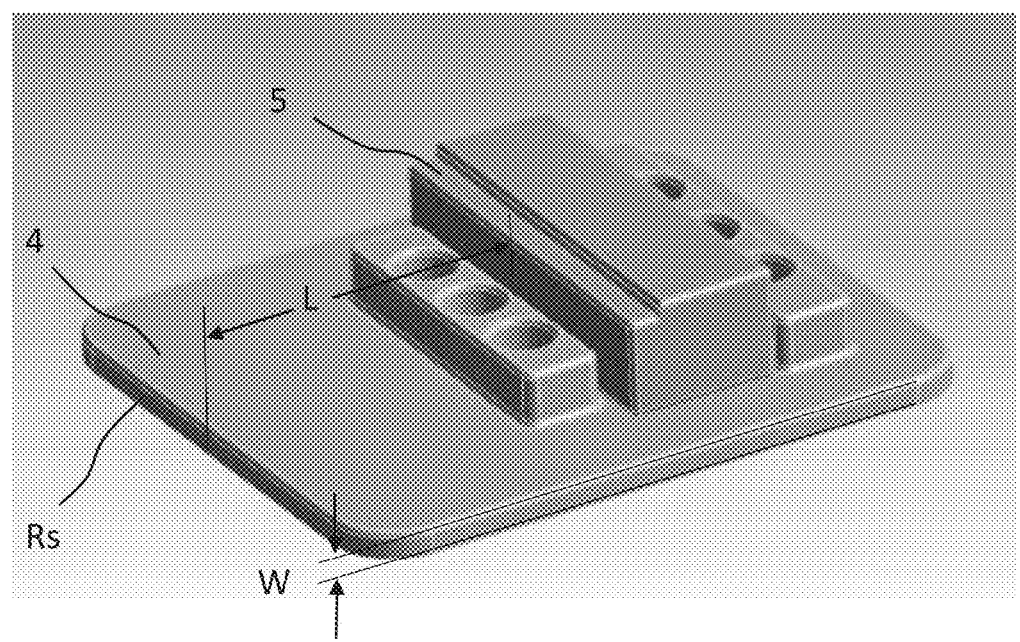
Figure 45:
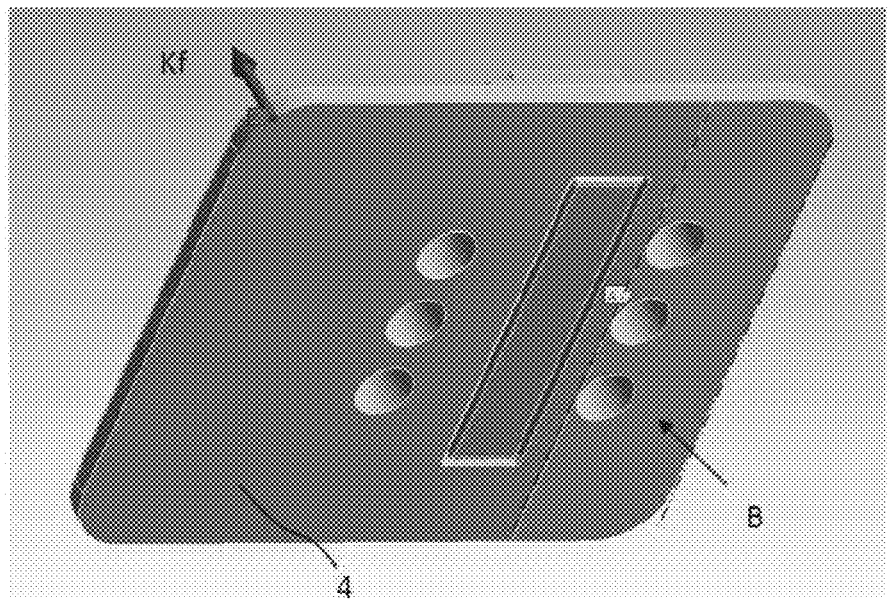
Figure 46:
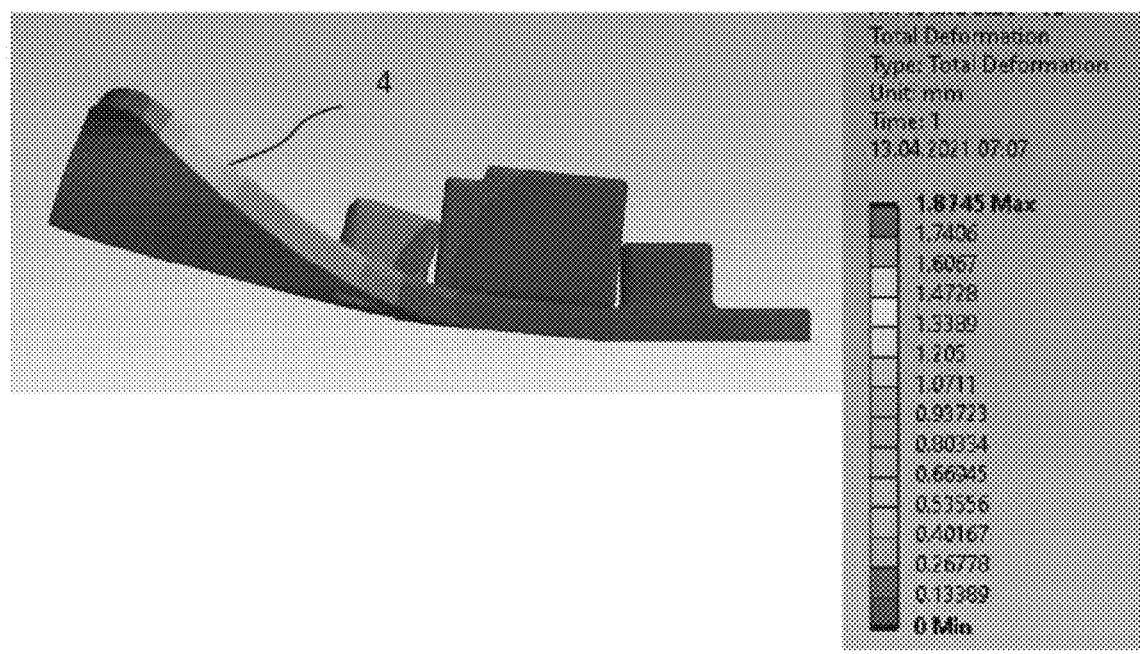
Figure 47:
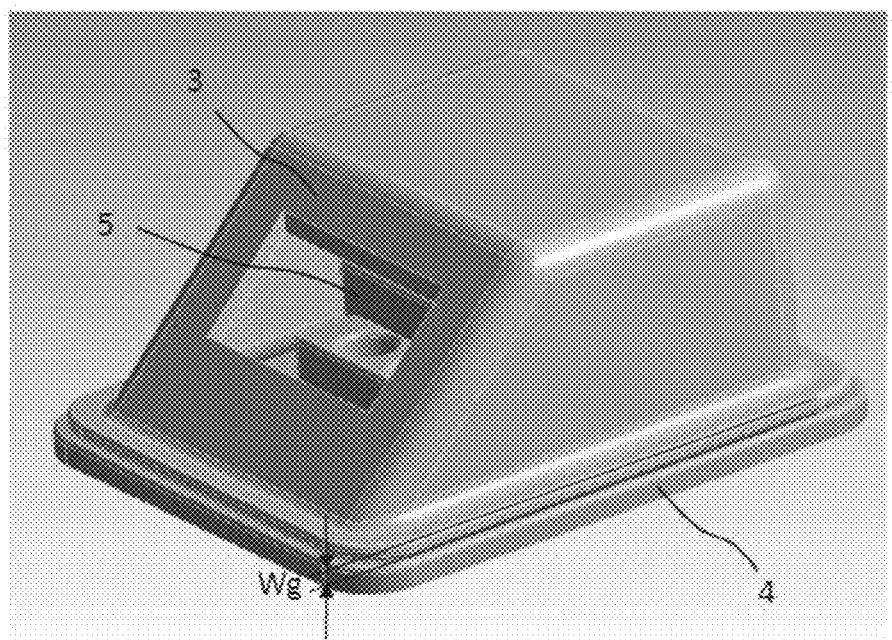
Figure 48:
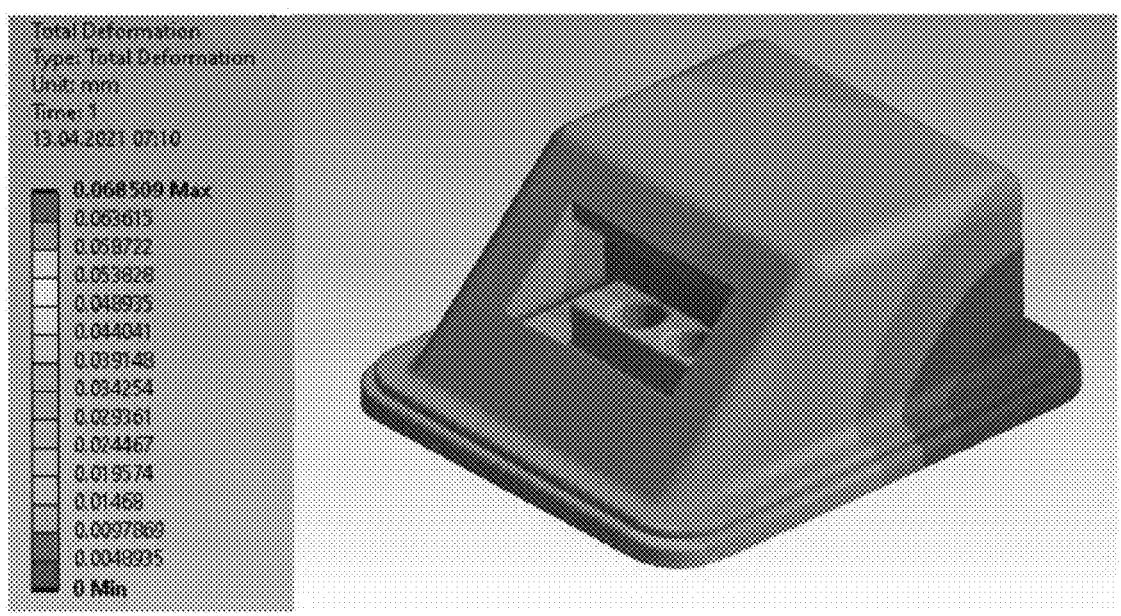
Figure 49:
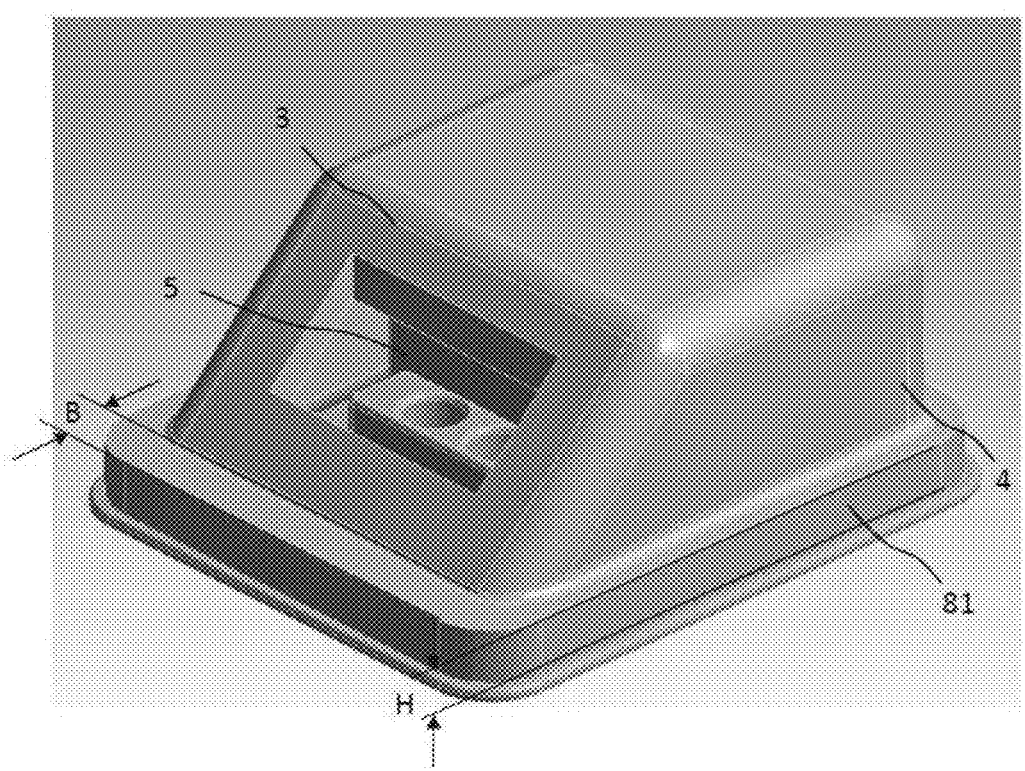
Figure 50:
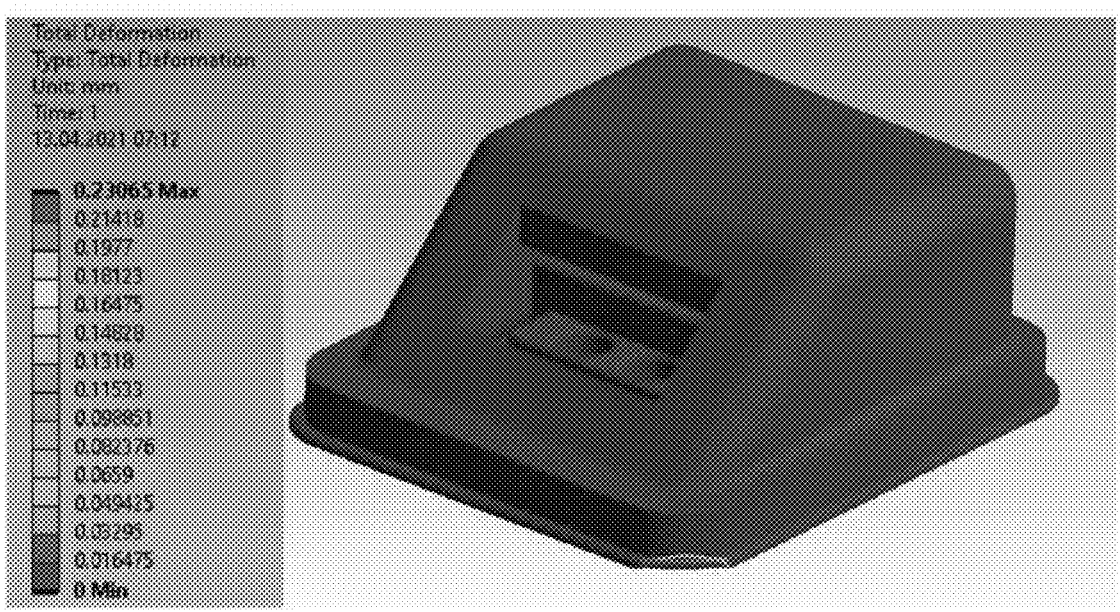

The invention will now be described in more detail by way of preferred embodiments and with reference to the accompanying drawings, wherein:

FIG. 1 is a perspective view, obliquely from the front and top, of a first embodiment of a multi-laser arrangement according to the present invention, with the housing cap partially illustrated as transparent;

FIG. 2 is a plan view of a first embodiment of the multi-laser arrangement according to the invention shown in FIG. 1;

FIG. 3 is a plan view of the base plate of the first embodiment of the multi-laser arrangement according to the invention shown in FIGS. 1 and 2;

FIG. 4 is a further perspective view, obliquely from the front and top, of the first embodiment of the multi-laser arrangement according to the invention shown in FIGS. 1 to 3, with the housing cap illustrated to be non-transparent;

FIG. 5 is a perspective view, obliquely from the front and top, of the base plate of a modification of the first embodiment of the multi-laser arrangement according to the invention shown in FIGS. 1 to 4, with depressions in the pedestal for arranging the respective lasers;

FIG. 6 is a cross-sectional view of the base plate along the sectional plane A-A' shown in FIG. 5;

FIG. 7 is a perspective view, obliquely from the front and top, of the base plate of the first embodiment of the multi-laser arrangement according to the invention shown in FIGS. 1 to 4, showing electrical connection lines extended through the base plate with bond wires attached thereto;

FIG. 8 is a perspective cross-sectional view of the first embodiment, with the sectional plane in parallel to a side wall of the housing cap in the area of the connection line to one of the lasers;

FIG. 9 is a perspective cross-sectional view of a second embodiment of the multi-laser arrangement of the present invention, with the sectional plane in parallel to a side wall of the housing cap in the area between the connection line to one of the lasers and the housing wall;

FIG. 10 is a cross-sectional view of a third embodiment of the multi-laser arrangement of the present invention, with the sectional plane in parallel to a side wall of the housing cap in the area of the connection line to one of the lasers;

FIG. 11 is a perspective cross-sectional view of a fourth embodiment of the multi-laser arrangement of the present invention, with the sectional plane in parallel to a side wall of the housing cap in the area of the connection line to one of the lasers;

FIG. 12 is a perspective cross-sectional view of a fifth embodiment of the multi-laser arrangement of the present invention, with the sectional plane in parallel to a side wall of the housing cap in the area of the connection line to one of the lasers;

FIG. 13 shows a detail of a plan view of the base plate of the fifth embodiment shown in FIG. 12, with the housing cap omitted;

FIG. 14 is a perspective cross-sectional view of a sixth embodiment of the multi-laser arrangement of the present invention, with the sectional plane in parallel to a side wall of the housing cap in the area of the connection line to one of the lasers;

FIG. 15 is a plan view of the base plate of the sixth embodiment shown in FIG. 14, with the housing cap omitted;

FIG. 16 shows a detail of a perspective view of the base plate of the sixth embodiment shown in FIG. 15, with the housing cap omitted;

FIG. 17 is another cross-sectional view of the third embodiment of the multi-laser arrangement of FIG. 10, obliquely from the front, with the sectional plane in parallel to a side wall of the housing cap in the area of the connection line to one of the lasers, in which the transparent element is attached to a frame using a glass solder, the frame being fixed on the housing cap;

FIG. 18 is a cross-sectional view of an embodiment of the multi-laser arrangement similar to the third embodiment obliquely from the front, with the sectional plane in parallel to a side wall of the housing cap in the area of the connection line to one of the lasers, in which the transparent element is fixed on the housing cap by an Au—Sn solder;

FIG. 19 is a cross-sectional view of a seventh embodiment of the present invention, which is similar to the fifth embodiment shown in FIG. 12, but with the pedestal formed integrally with the base plate, and with the sectional plane in parallel to a side wall of the housing cap in the area between the connection line to one of the lasers and the side wall;

FIG. 20 is a cross-sectional view, obliquely from the front, of the seventh embodiment shown in FIG. 19, with the sectional plane in parallel to a side wall of the housing cap in the area between the connection line to one of the lasers and the side wall;

FIG. 21 is a perspective cross-sectional view of the second embodiment of the multi-laser arrangement as shown in FIG. 9, with the sectional plane in parallel to a side wall of the housing cap in the area between the connection line to one of the lasers and the housing wall, illustrating the absorption of the light exiting from the rear light exit face of the laser on a coated housing cap;

FIG. 22 is a cross-sectional view of an internally coated housing cap, cut approximately vertically through the center of the housing cap, showing a transparent element on which an FAC lens is arranged;

FIG. 23 is a perspective view, obliquely from the front, of an eighth embodiment of the multi-laser arrangement of the present invention, with the transparent element arranged obliquely to the main direction of laser emission;

FIG. 24 is a cross-sectional view of the embodiment of the multi-laser arrangement shown in FIG. 22, with the sectional plane in parallel to the upper wall of the housing cap directly below the upper wall of the housing cap;

FIG. 25 is a perspective view, obliquely from the front, of a housing cap of a ninth embodiment of the multi-laser arrangement of the present invention, with the transparent element omitted, in which the housing cap has a plurality of openings for the passage of laser light;

FIG. 26 is a cross-sectional view of the ninth embodiment of the multi-laser arrangement corresponding to the housing cap shown in FIG. 25, with the sectional plane in parallel to the upper wall of the housing cap directly below the upper wall of the housing cap;

FIG. 27 is a cross-sectional view of a tenth embodiment of the present invention, in which the light exiting from a laser is injected into a fiber that has its entry end arranged close to the light exit face of the laser, which fiber is held on the housing cap, and with the sectional plane in parallel to a side wall of the housing cap in the area of the connection line to one of the lasers;

FIG. 28 is a cross-sectional view of an eleventh embodiment of the multi-laser arrangement of the present invention, in which the transparent element is in the form of a fiber board, and with the sectional plane in parallel to a side wall of the housing cap in the area of the connection line to one of the lasers;

FIG. 29 is a perspective view, obliquely from above, of a twelfth embodiment of the multi-laser arrangement of the present invention, in which the base plate serves as a carrier for optical assemblies and protrudes forward from below the housing cap;

FIG. 30 shows a detail of the perspective view shown in FIG. 29, with the respective beam paths of the lasers when in operation;

FIG. 31 shows a comparison of multi-laser arrangements, with a rectangular housing cap and with a housing cap having an angled, in particular inclined housing wall carrying the transparent element, in each case in a cross-sectional view with the sectional plane in parallel to a side wall of the housing cap in the area of the connection line to one of the lasers;

FIGS. 32A, 32B, 32C and 32D together show a comparison of different designs of multi-laser arrangements, with a rectangular housing cap and with a housing cap with an angled, in particular inclined housing wall supporting the transparent element, in each case in a cross-sectional view with the sectional plane in parallel to a side wall of the housing cap in the area of the connection line to one of the lasers;

FIG. 33 is a perspective view, partially broken-away, of exemplary AR glasses including the multi-laser arrangement according to the present invention;

FIG. 34 is a perspective cross-sectional view, obliquely from the front, of a thirteenth embodiment of the multi-laser arrangement of the present invention, with the sectional plane in parallel to a side wall of the housing cap in the area between the connection line to one of the lasers and the housing wall, and in which the housing cap has a plurality of openings for the passage of laser light, with a respective hot-formed optical element held in each one thereof;

FIG. 35 is a perspective cross-sectional view, obliquely from the front, of a fourteenth embodiment of the multi-laser arrangement of the present invention, with the sectional plane in parallel to a side wall of the housing cap in the area between the connection line to one of the lasers and the housing wall, and in which the housing cap has a plurality of openings for the passage of laser light, with a respective preformed, in particular biconvex optical element held in each one thereof, preferably by a solder bond or by action of mechanical pressure;

FIG. 36 is a perspective cross-sectional view, obliquely from the front, of a fifteenth embodiment of the multi-laser arrangement of the present invention, with the sectional plane in parallel to a side wall of the housing cap in the area between the connection line to one of the lasers and the housing wall, and in which the housing cap has a plurality of openings for the passage of laser light, with a respective preformed, in particular plano-convex optical element held in each one thereof, preferably by a solder glass;

FIG. 37 is a perspective cross-sectional view, obliquely from the front, of a sixteenth embodiment of the multi-laser arrangement of the present invention, with the sectional plane in parallel to a side wall of the housing cap in the area between the connection line to one of the lasers and the housing wall, and in which the housing cap has a plurality of openings for the passage of laser light, with a respective preformed, in particular aspherical optical element held in each one thereof, preferably by having been thermally fused thereto and preferably by action of mechanical pressure;

FIG. 38 is a perspective cross-sectional view, obliquely from the front, of a seventeenth embodiment of the multi-laser arrangement of the present invention, with the sectional plane in parallel to a side wall of the housing cap in the area of the connection line to one of the lasers, and in which an area facing the light exit face of the lasers inside the housing has an absorbent coating;

FIG. 39 is a cross-sectional side view of an eighteenth embodiment of the multi-laser arrangement of the present invention, with the sectional plane in parallel to a side wall of the housing cap in the area of the connection line to one of the lasers, and in which the light exiting from a laser is injected into a fiber that has its entry end arranged close to the light exit face of the laser, which fiber is fixed on the housing cap and is terminated by a plug-in connection with an external fiber;

FIG. 40 is a cross-sectional side view of a nineteenth embodiment of the multi-laser arrangement of the present invention, with the sectional plane in parallel to a side wall of the housing cap in the area of the connection line to one of the lasers, and in which the light exiting from a laser is injected into a fiber that has its entry end arranged close to the light exit face of the laser, which fiber is fixed on the housing cap in an external connector;

FIG. 41 is a cross-sectional side view of a twentieth embodiment of the multi-laser arrangement of the present invention, with the sectional plane in parallel to the upper wall of the housing cap directly below the upper wall of the housing cap, and in which the light exiting from a laser is injected into a respective fiber that has its entry end arranged close to the light exit face of the laser, which fiber is fixed on the housing cap and is terminated by a plug-in connection with an external fiber;

FIG. 42A shows the intensity distribution of a bundle of optical fibers coupled to the multi-laser arrangement at the exit end of the bundle perpendicular to the longitudinal extension of the fiber bundle, with the individual fibers, each one coupled to a laser of the multi-laser arrangement, arranged next to one another in a plane of the scanning direction of an associated imaging device;

FIG. 42B shows the intensity distribution of a bundle of optical fibers coupled to the multi-laser arrangement at the exit end of the bundle perpendicular to the longitudinal extension of the fiber bundle, with the individual fibers, each one coupled to a laser of the multi-laser arrangement, positioned in a spatial arrangement next to one another as close as possible;

FIG. 42C shows a cross-sectional view of a bundle of optical fibers coupled to the multi-laser arrangement, with the sectional plane B-B' as shown in FIG. 41, perpendicular to the longitudinal extension of the fiber bundle at a distance from the exit end thereof, with the individual fibers, each one coupled to a laser of the multi-laser arrangement, positioned in a spatial arrangement next to one another as close as possible, and with a diffuser element arranged between the fibers and extending along the longitudinal extension of the fibers;

FIG. 42D shows the intensity distribution of a bundle of optical fibers coupled to the multi-laser arrangement as shown in FIG. 42C at the exit end thereof perpendicular to the longitudinal extension of the fiber;

FIG. 43 is a perspective view, partially broken-away, of further exemplary AR glasses, in which the multi-laser arrangement according to the present invention is connected to further optical assemblies by an optical fiber:

FIG. 44 shows an exemplary perspective view of a base plate with pedestal arranged thereon on which mechanical load tests were performed, in particular by way of a predefined simulated introduction of force;

FIG. 45 shows a setup for mechanical load test by simulated predefined introduction of force into the base plate with pedestal arranged thereon to determine deformations of the base plate or of the base plate with pedestal arranged thereon and with housing cap placed thereon;

FIG. 46 shows the deformations caused in the mechanical load test by simulated predefined introduction of force into the base plate;

FIG. 47 shows an embodiment of a base plate with a housing cap fixed thereon and a pedestal attached to the base plate of a presently disclosed multi-laser arrangement;

FIG. 48 shows results of the load test by simulated predefined introduction of force into the base plate of the embodiment shown in FIG. 47;

FIG. 49 shows a further embodiment of a base plate with a housing cap fixed thereon and a pedestal attached to the base plate of a presently disclosed multi-laser arrangement, in which the housing cap has a lateral projection extending from the base plate; and FIG. 50 shows results of the load test by simulated predefined introduction of force into the base plate of the embodiment shown in FIG. 49.

Corresponding reference characters indicate corresponding parts throughout the several views. The exemplifications set out herein illustrate embodiments of the invention and such exemplifications are not to be construed as limiting the scope of the invention in any manner.

DETAILED DESCRIPTION OF THE INVENTION

In the following description of preferred embodiments, the same reference symbols denote the same or equivalent assemblies or components. The views in the accompanying figures are not drawn to scale, merely for the sake of better understanding.

Referring now to FIG. 1, which is a perspective view of a first embodiment of a multi-laser arrangement 1 according to the present invention in a view obliquely from the front and top. A housing 2 of multi-laser arrangement 1 includes a housing cap 3 which is secured to a base plate 4 in a fluid-tight and hermetically sealed manner.

Housing cap 3 comprises or is made of a metal or a metallic alloy, in particular a deep-drawable metal or a deep-drawable alloy. As already mentioned above, the base plate 4 also comprises or is made of metal or of a metallic alloy and is joined to the housing cap 3 by welding.

Only by way of example, FIG. 9 shows the weld seam S provided between housing cap 3 and base plate 4, which extends substantially along the entire contact area between housing cap 3 and base plate 4 below a lateral projection As of housing cap 3, which defines a welding flange.

The process producing weld seam S is performed in a very short time interval, and the material of both housing cap 3 and base plate 4 is capable of dissipating the resulting heat in a way so that pedestal 5 and lasers 6, 7, and 8 disposed thereon, which are in the form of semiconductor lasers 6, 7, and 8, are only slightly heated. As a result, neither these semiconductors nor any other semiconductor materials located in housing 2, such as, for example, those of monitor diodes, are damaged or impaired.

Moreover, flux, as used in soldering processes, for example, is not required, and the interior of housing 2 can be sealed reliably and fluid- and hermetically-tightly without detrimental components from the atmosphere, preferably under a protective gas atmosphere such as dry nitrogen.

In the context of the present disclosure, an article, such as housing 2 of multi-laser arrangement 1, is regarded as hermetically tight or fluid-tight if it exhibits a leak rate of less than $1 \cdot 10^{-3}$ mbar·l/s when filled with He and at a pressure difference of 1 bar at room temperature. Herein, He is used to mean Helium, when used as in the previous sentence, and He is also used to represent a distance or height, as in height He, the use of He herein is clear by the context in which He is used.

Preferably, however, a leak rate of $1 \cdot 10^{-8}$ mbar·l/s is achieved when filled with He and at a pressure difference of 1 bar. Since the level of tightness to be achieved can depend on the internal volume of the housing, the tightness achieved in the present case ensures that a partial pressure of water in the housing of the multi-laser arrangement does not exceed 5000 ppm during the entire service life of the component.

Furthermore, this welded joint contributes to the fact that housing 2 complies with method 1014 and method 1018 of the MIL-STD 883 standard under long-term continuous operation.

A pedestal 5 is arranged on base plate 4 or, in other embodiments, is defined by base plate 4 itself, for example, in the embodiments shown in FIGS. 9, 10, 17-21, 24, 26, 27, 28, 31, 32A, 32B, 32C and 32D.

In preferred embodiments, housing 2 accommodates a first laser 6 emitting in the red spectral range of the visible spectrum, a second laser 7 emitting in the green spectral range of the visible spectrum, and a third laser 8 emitting in the blue spectral range of the visible spectrum. Alternatively, more than one of lasers 6, 7, 8 or all lasers 6, 7, 8 may emit light in the same spectral range, which may be advantageous, for example, when multi-laser arrangement 1 is employed for lighting purposes.

Each of the aforementioned lasers 6, 7, and 8 is arranged on pedestal 5 and is attached thereto such that each of these lasers 6, 7, and 8 is arranged at a predefined spacing from lower surface 9 of base plate 4. Lower surface 9 of base plate 4 refers to the underside thereof, as seen in FIG. 3, for example. This defines a predefined position of lasers 6, 7, and 8 with respect to the spacing from lower surface 9 of base plate 4 for the installation of the multi-laser module, which allows multi-laser arrangement 1 to be precisely installed in further assemblies.

As an alternative to arranging respective separate lasers 6, 7, and 8, these lasers may optionally also be provided in the form of a pre-assembled multi-laser module with the lasers already aligned to one another. This is further promoted by the fact that lasers 6, 7, and 8 are each arranged on pedestal 5 in alignment with one another.

In order to contribute to, or allow, the alignment of lasers 6, 7, and 8 relative to one another with high precision during assembly, depressions E6, E7, and E8 are provided in the upper surface of pedestal 5 for accommodating respective lasers 6, 7, and 8, so that they are aligned relative to one another and preferably in a form-fitting manner, as can be seen in FIGS. 5 and 6, for example. Depressions E6, E7, and E8 may already be stamped into pedestal 5 during manufacture thereof, or may be produced by an independent precise manufacturing step, for example by a material-removing process such as milling or spark erosion. This also supports automated fabrication of multi-laser arrangement 1, for example by pick-and-place production techniques.

In this case, the distance of lasers 6, 7, and 8 in a Z direction will not be defined by a height H of the upper surface of pedestal 5 from lower surface 9 (or underside 9) of base plate 4, as in the further disclosed embodiments, instead, the respective distance He results from the height He as indicated in FIG. 6, that is from the respective distance between the lower surface 9 or underside 9 of base plate 4 and countersunk surface OE6, OE7, or OE8 of depression E6, E7, or E8. As far as specific dimensions are disclosed for height H, these shall in general similarly apply to the height He for the embodiment described in the present and the preceding paragraph. In more detail, pedestal 5 may have a height of between 0.5 and 1 mm, and height He may accordingly be between 0.35 and 0.9 mm.

The aforementioned alignment may include that the main emission direction H6, H7, and H8 of lasers 6, 7, and 8 is parallel to one another and that the spacing between front light exit faces 10, 11, and 12, that is the exit faces of the respective useful light of lasers 6, 7, and 8 is predefined in the lateral direction, so that an exactly predefined connection geometry is already obtained for an optical assembly to which multi-laser arrangement 1 is to be connected, which allows multi-laser arrangement 1 to be precisely installed in further external assemblies, see, for example FIG. 2, in which this orientation of the main emission directions H6, H7, and H8 can be seen.

In order to be able to define the terms "laterally", "in front of", "behind", "above" or "below" more clearly, reference is made to FIG. 4 which shows a further perspective view of the first embodiment of the multi-laser arrangement according to the invention as shown in FIGS. 1 to 3 and coordinate axes X, Y, and Z of a Cartesian coordinate system, with reference symbols X, Y, and Z marking the end of the respective double arrow pointing in the positive direction.

The wording "laterally aligned arrangement" thus refers to the respective spacing between lasers 6, 7, and 8, in particular the spacing of their front light exit faces 10, 11 and 12 in the Y direction.

As mentioned above, the position of the level of lasers 6, 7, and 8, i.e. their location relative to the Z direction, is defined by the distance between lower surface 9 of base plate 4 and height H of pedestal 5, which can also be seen in FIG. 6, by way of example. What can also be clearly seen in this FIG. 6 is that, in this embodiment, the underside of pedestal 5 is exposed at the bottom, so that a downward connection can be made to a further assembly, which is however not illustrated in the figures, and that the underside of pedestal 5 is flush with the plane defined by the lower surface or underside 9 of base plate 4.

An emission of laser light in the positive X direction is referred to as being directed forward, and an emission of laser light in the negative X direction is referred to as being directed backwards or rearwards.

In front of front light exit faces 10, 11, and 12 of lasers 6, 7, and 8, an opening 13 is provided in housing cap 3, to which a transparent element 14 is attached from the inside of housing 2, see, e.g., FIG. 4 and others.

Transparent element 14 may comprise glass or may be made of glass. Here, the wording "comprise glass" is also intended to indicate that the transparent element may be coated or, depending on the application, may even have multiple layers, for example with color filter assemblies.

However, in many of the embodiments of multi-laser arrangement 1 discussed in more detail below, it will not be necessary to apply for instance an anti-reflective coating to transparent element 14, for example due to an inclination or tilt of transparent element 14 relative to main emission direction H6, H7, and H8 of lasers 6, 7, and 8.

In a preferred embodiment, transparent element 14 is fixed on housing cap 3 or on a frame R by a glass solder, which frame R can be easily seen in FIG. 9, for example, and which is itself fixed on housing 3 by a soldering process in this embodiment.

This frame R may be made of "Alloy 52", for example, a NiFe alloy, and can be produced as a drawn part with a thickness of about 0.15 mm.

In an alternative embodiment, transparent element 14 itself is fixed on housing cap 3 by a gold solder, for example an AuSn solder.

The use of gold solder allows for the direct attachment of window 14 to housing cap 3, with fewer requirements on the structural dimensions both on transparent element 14 and on housing cap 3.

A corresponding comparison will be apparent from FIGS. 17 and 18. FIG. 17 shows a cross-sectional view of an embodiment of multi-laser arrangement 1 that is also referred to as a third embodiment, with the sectional plane in parallel to a side wall of housing cap 3 in the area of connection line Z to one of lasers 6, 7 or 8, in which transparent element 14 is attached to frame R using a glass solder G, and frame R in turn is fixed on housing cap 3.

FIG. 18 shows a cross-sectional view of an embodiment of multi-laser arrangement 1, similar to the third embodiment mentioned above, obliquely from the front, with the sectional plane again in parallel to a side wall of housing cap 3 in the area of connection line Z to one of lasers 6, 7 or 8, in which transparent element 14 is fixed on housing cap 3 by an AuSn solder A.

It is apparent here that the area on housing cap 3 covered by transparent element 14 or frame R is smaller when using the gold solder A than when using glass solder G, and as a result, housing 2 itself may also become smaller.

For example, a width Bg of the layer of solder glass G that holds transparent element 14 or frame R can be reduced from 0.85 mm to a width Ba of 0.35 mm when a gold solder A is used. As a result, height Hg of housing 2 shown in FIG. 17, which has a rectangular cross section and in which glass solder G was used, can be reduced from approximately 3.16 mm, for example, to height Ha of about 2.16 mm, for example, of housing 2 shown in FIG. 18, which also has a rectangular cross section and in which gold solder A was used.

Together with the reduced height Ha extending in the Z direction, the further dimensions of housing cap 3 in the X and Y directions and thus of housing 2 can also be reduced approximately proportionally to this reduction, by the factor Ha/Hg.

A further reduction in height of housing 2 can be achieved if at least that wall of housing cap 3 on which transparent element 14 is arranged is inclined relative to base plate 3.

FIG. 31 shows the comparison of multi-laser arrangements 1 with a housing cap 3 of rectangular cross-section on the left side of this figure and a housing cap 3 with an angled, in particular inclined housing wall carrying transparent element 14 on the right side thereof.

The angle of inclination a shown in the embodiment illustrated on the right of FIG. 31 may be 45°, for example, as shown in this figure. As a result, the height of housing 2 can be reduced by approximately the amount of cos(45°) and thus by approximately a factor of 0.7.

In further embodiments, instead of being exactly 45°, the angle of inclination a of the wall of housing cap 3, relative to the normal direction N of the lower surface 9 of base plate 4, may, more generally, also be in a range from 35° to 60°, preferably from 40° to 50°, most preferably in a range from 43° to 48°.

Overall, the measures described above result in attractive changes in the size of housing 2, in particular, in its height, which are shown in FIGS. 32A-32D, by way of example and true to scale.

FIGS. 32A to 32D show a comparison of the different designs of multi-laser arrangements 1 with a rectangular housing cap 3 and a housing cap 3 with an angled housing wall carrying transparent element 14, in each case in a cross-sectional view in which the sectional plane is parallel to a side wall of housing cap 3 in the area of connection line Z to one of lasers 6, 7 or 8.

Figures 32A, 32B, 32C, 32D:
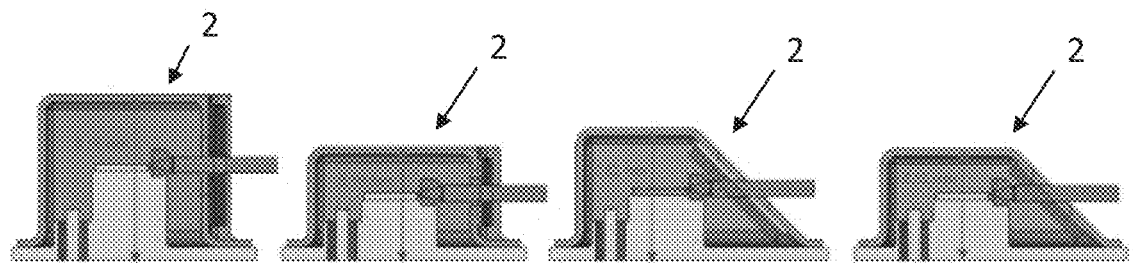

FIG. 32A shows a housing 2 of rectangular cross section, in which transparent element 14 is fixed to housing cap 3 by a glass solder, in particular using a frame R, and in which a height of housing of 3.16 mm is obtained, as mentioned above.

FIG. 32B shows a housing 2 of rectangular cross section, in which transparent element 14 is fixed to housing cap 3 by a gold solder and in which a height of the housing of approximately 2.16 mm is achieved, as mentioned above.

FIG. 32C shows a housing 2 in which transparent element 14 is fixed to an inclined wall of housing cap 3 using a glass solder, whereby a height of the housing of approximately 2.52 mm is achieved.

FIG. 32D shows a housing 2 in which transparent element 14 is fixed to an inclined wall of housing cap 3 using a gold solder, whereby a height of the housing of approximately 2.12 mm is achieved.

This housing height is extremely attractive for many in particular mobile applications, of which only one is shown in FIG. 33 in the form of AR glasses, by way of example, which will be described in more detail further below.

The angle of inclination a of transparent element 14 as illustrated in the embodiment shown on the right of FIG. 31 may contribute to further structural advantages, in particular if, for example, a monitor diode 19, 20, and/or 21 is arranged below transparent element 14 and laser light reflected back from transparent element 14 is incident on monitor diode 19, 20, and/or 21, as shown in FIGS. 1, 2, and 8 by way of example, to which reference will be made below.

FIG. 8 shows a perspective cross-sectional view of the first preferred embodiment, in which the sectional plane is parallel to a side wall of the housing cap in the area of connection line Z to one of lasers 6, 7, or 8.

Monitor diodes 19, 20, and 21 are disposed below transparent element 14, each one receiving light from an associated laser 6, 7, or 8, which is reflected back from transparent element 14.

Merely by way of example, this is described below with reference to the main emission direction H6 of laser 6 which emits light in the red spectral range.

The light exiting laser 6 in main emission direction H6 is incident on transparent element 14 and, since the latter is arranged at an angle of 45° relative to main emission direction H6, a reflected portion thereof is deflected vertically downwards, onto monitor diode 19. This similarly applies to the light from laser 7 in main emission direction H7 and reflected perpendicular thereto and to monitor diode 20, and to the light from laser 8 in main emission direction H8 and reflected perpendicular thereto and to monitor diode 21.

The intensity of the respective reflected light portion is sufficient to obtain a very precise sensor signal for the respective intensity of the light emitted by lasers 6, 7, and 8.

It is advantageous here if the light emerging from FAC lens 18 after leaving FAC lens 18 through exit face 22 thereof only exhibits slight beam divergence in the horizontal direction, i.e. in the Y direction, in particular in order to thereby avoid undesirable faulty light for the respective further monitor diodes.

In the preferred embodiments of multi-laser arrangement 1, Fast Axis Collimation (FAC) lens 18 is arranged on pedestal 5, preferably spaced apart from the end face of lasers 6, 7, and 8, the end faces of lasers 6, 7, and 8 corresponding to the already discussed light exit faces 10, 11, and 12 of these lasers 6, 7, and 8. In this way, very effective beam shaping can be achieved, and the spacing allows to minimize thermal impacts such as caused by pedestal 5 heating up. This allows the arrangement to generate light beams leaving the respective laser 6, 7, or 8 in the respective main emission direction H6, H7, or H8 with a beam diameter Ds in Y direction of only about 0.3 mm, for example.

If monitor diodes 19, 20, and 21 each include color filters, in particular color filters in the form of a bandpass for the respective emission wavelength of the respectively associated laser 6, 7, or 8, this allows them to suppress the light from the respective further lasers and to obtain a better signal-to-interference signal or better signal-to-noise ratio of the sensory signals of monitor diodes 19, 20, and 21 in this embodiment as well as in all other presently disclosed embodiments using these monitor diodes 19, 20, and 21.

An alternative arrangement in which transparent element 14 is in the form of an FAC lens (fast axis collimation lens) 15 or comprises an FAC lens (fast axis collimation lens) 15 is shown in FIG. 22. In this case, FAC lens 15 may be placed on a plane-parallel substrate 16 or may be provided in the form of an integrally shaped FAC lens 15, for example by being stamped into a corresponding shape.

FIG. 22 furthermore shows that the inner surface of housing cap 3 is blackened, in particular blackened with a matt finish, as indicated by reference symbol T. For this purpose, a paint or a coating such as a black chrome coating or zinc-nickel coating can be used, in particular also as an electrolytic coating.

By way of example, FIG. 21 shows the second embodiment of multi-laser arrangement 1 illustrating the absorption of the light emerging from the rear light exit face of lasers 6, 7, and 8 on a coated housing cap 3. Since many coatings might interfere with the welding, the welding flange as defined by lateral projection As and on which weld seam S is formed, as also shown in FIG. 9 by way of example, may be kept free of the coating on the underside of housing cap 3, so that the coatings described here will not have any adverse impact on the hermetic joint between housing cap 3 and base plate 4.

As an alternative, monitor diodes 19, 20, 21 may also be arranged behind lasers 6, 7, and 8, in particular on a carrier 23 associated therewith, as is shown in FIGS. 12 and 14 by way of example.

In the embodiment shown in FIGS. 12 and 13, the light exiting rearwards from lasers 6, 7, and 8 is reflected on the inclined rear wall of housing 2 and is then incident on monitor diodes 19, 20, and 21 which are disposed directly above their respective connection lines Z.

FIG. 12 shows a perspective cross-sectional view of a fifth embodiment of multi-laser arrangement 1, with the sectional plane in parallel to a side wall of housing cap 3 in the area of the connection line Z to one of the lasers, and FIG. 13 shows a detail of a plan view of base plate 4 of the fifth embodiment shown in FIG. 12, with housing cap 3 omitted.

As an alternative, monitor diodes 19, 20, and 21 may also be arranged on a carrier 23 as shown in FIGS. 14, 15, and 16, which preferably comprises ceramics or is made of ceramics.

FIG. 14 shows a perspective cross-sectional view of a sixth embodiment of multi-laser arrangement 1, with the sectional plane in parallel to a side wall of housing cap 3 in the area of the connection line Z to one of the lasers.

FIG. 15 shows a plan view of base plate 4 of the sixth embodiment, shown in FIG. 14, with housing cap 3 omitted, and from this view as well as from FIG. 16 it can be seen that, in this embodiment, the normal direction Nt of the surface of carrier 23 on which monitor diodes 19, 20, 21 are arranged, is provided at an inclination relative to main emission direction H7 of at least laser 7, which inclination relative to main emission direction H7 is in an angular range of angle β from 3° to 15°, preferably from 5° to 10°, most preferably from 6° to 8°.

As shown in FIG. 16, monitor diodes 19, 20, and 21 may each be electrically connected via conductors disposed on ceramic carrier 23, of which conductors 24 and 25 are shown as an example for monitor diode 19 in FIG. 16.

Similarly as disclosed for carrier 23, the wall of housing cap 3 on which transparent element 14 is arranged may also be provided at an inclination relative to the main emission direction of at least one of the lasers, which is shown in FIGS. 23 and 24 by way of example.

FIGS. 23 and 24 each show a view of an eighth embodiment of multi-laser arrangement 1, in which the normal direction Nw of at least that wall of housing cap 3 on which transparent element 14 is arranged is inclined relative to main emission direction H6 of at least laser 6, which inclination at an angle γ relative to the main emission direction is in an angular range from 3° to 15°, preferably from 5° to 10°, most preferably from 6° to 8°.

FIG. 27 shows a cross-sectional view of a tenth embodiment in which the light exiting from a laser 6 is directed, i.e. injected into an optical fiber 27 that has its entry end 26 arranged close to light exit face 12 of laser 6, which fiber 27 is fixed on housing cap 3 or on a transparent element 14 having feedthroughs for fiber 27 by substantially spherical fused glass 28, 29. As shown for laser 6, further fibers can be similarly arranged for lasers 7 and 8 and fixed on housing cap 3 or transparent element 14.

In a further embodiment, transparent element 14 may else be provided in the form of a fiber board 17 or may comprise a fiber board 17, as shown in FIG. 28, by way of example. Such a fiberboard which is known to the person skilled in the art includes a large number of optical fibers arranged next to one another, and light incident onto fiberboard 17 is guided in these fibers so that the divergence of the light from lasers 6, 7, and 8 is thereby reduced and the light can be guided substantially in parallel.

Another embodiment, in which housing cap 3 has a plurality of openings 30, 31, and 32, is shown in FIGS. 25 and 26.

FIG. 25 shows the perspective view of a housing cap 3 of a ninth embodiment of multi-laser arrangement 1, in which transparent element 14 has been omitted and in which housing cap 3 has three openings 30, 31, and 32 for the passage of laser light.

FIG. 26 is a cross-sectional view of the ninth embodiment of the multi-laser arrangement corresponding to the housing cap as shown in FIG. 25, with the sectional plane in parallel to the upper wall of housing cap 3 directly below the upper wall of housing cap 3, where it can be seen that boundaries are provided for the laser light passing through openings 30, 31, and 32, which boundaries laterally restrict the respective laser light and can thus contribute to a suppression of spurious light. In this embodiment, each of these openings 30, 31, and 32 may have a separate transparent element 14 associated therewith, or all of these openings may share one common transparent element 14 associated therewith.

FIGS. 25 and 26 also show protective means 33 for glass of transparent element 14 provided on housing 2, in particular in the form of a portion 34 laterally protruding beyond transparent element 14.

A further advantageous embodiment can be seen in FIGS. 29 and 30, with FIG. 29 showing a twelfth embodiment of multi-laser arrangement 1, in which base plate 4 is in the form of a carrier for optical assemblies and protrudes forward from below housing cap 3, and with FIG. 30 showing a detail of the perspective view of FIG. 29 with lasers 6, 7, and 8 in operation, with their respective beam paths and main emission directions H6, H7, and H8.

The optical assemblies may, for example, include beam collimators 35, 36, 37 and dichroic beam splitters or beam combiners 38, 39, 40, and may in this way allow to supply the light from lasers 6, 7, and 8 to other assemblies in a very compact space, coaxially and as if it comes from a single virtual source.

All the embodiments presently described have in common that an electrical connection line Z, Z1, Z2, Z3 is routed through housing 2 to a respective laser 6, 7, 8, as can be seen in FIG. 3 by way of example.

If, for example, base plate 3 of housing 2 is designed to be on reference potential and carries current, this allows to provide a multi-laser arrangement which can be operated with just four electrical connections.

Furthermore, in particular in order to contribute to long-term operational durability and hermeticity of housing 2, glass-to-metal feedthroughs may be provided in base plate 4 for connection lines Z, Z6, Z7, Z8 to lasers 6, 7, and 8 and for further connection lines 19, 20, and 21 to monitor diodes 19, 20, 21, as illustrated in FIG. 3 by way of example.

As shown in FIG. 7 by way of example, these connection lines Z, Z6, Z7, Z8 may also be routed to lasers 6, 7, and 8 via bonding wires B6, B7, and B8.

In order to gain a better understanding of the structural relationships, FIG. 5 shows a perspective view, obliquely from the front and top, of a modification of base plate 4 with pedestal 5 of the first embodiment of the multi-laser arrangement 1 according to the invention as shown in FIGS. 1 to 4, which is provided with depressions E6, E7, and E8 in pedestal 5 for arranging the respective laser 6, 7, and 8, and FIG. 6 is a cross-sectional view of the base plate along sectional plane A-A' as shown in FIG. 5.

For example, the glass-to-metal feedthroughs for the connection lines to the lasers and/or to the monitor diodes may have a height Hd of 0.75 mm, and base plate 4 may have a thickness D of approximately 0.25 mm.

An exemplary application is illustrated in the perspective view of FIG. 33 in the form of AR glasses 41 which include multi-laser arrangement 1 according to the present invention arranged in a glasses temple, as will now be explained in more detail.

The light emitted by multi-laser arrangement 1 is fed to optical assemblies 42 which have a beam-shaping effect and feed this light to a projection device 43 which produces a projection onto a spectacle lens of AR glasses 41, superimposed on the natural image visually perceived by a user.

Further sensors 44, 45, and 46 are used to recognize the environment and to identify the user.

Exchangeable spectacle lenses 47 increase user comfort.

A wireless transmission module 49, in particular a 5G module, allows communication with external devices, in particular mobile external devices, in particular under the control of a processor 48.

A rechargeable battery 50 is connected to the electronic assemblies of AR glasses 41 via a safety device 51 and provides for mobile operation thereof.

Referring now to FIG. 34 which shows a thirteenth embodiment of multi-laser arrangement 1 in which housing cap 3 has a plurality of openings for the passage of laser light, with a respective hot-formed optical element 52, 53, 54 held in each one thereof. Each of optical elements 52, 53, 54 defines a transparent element 14 which, as disclosed herein, is held in housing cap 3 in a hermetically sealed and fluid-tight manner, as is the case with the optical elements of the embodiments shown in FIGS. 35, 36, and 37.

In this thirteenth embodiment, optical elements 52, 53, 54 can be hot-formed in housing cap 3, for example by introducing a glass blank of the respective optical element 52, 53, 54 into the respective opening 30, 31, 32 of housing cap 3 and heating it long enough, in particular to above the glass transition temperature Tg and the hemispherical temperature of the glass the blank is made of until the shape of the respective optical element 52, 53, 54 forms due to the surface tension of the glass of the respective blank. Housing cap 3 advantageously defines a circumferential annular flange 55 around each opening 30, 31, 32, which is only shown for opening 30, by way of example, and which is delimited radially by an annular circumferential recess or groove 56. This provides a very precise outer frame at the radially outer end of annular flange 55 for the molten glass that is hot-shaped under its surface tension, which allows to precisely form a predefined surface of the respective optical element 52, 53, 54.

Referring now to FIG. 35 which shows a perspective cross-sectional view of a fourteenth embodiment of multi-laser arrangement 1. In this embodiment, again, housing cap 3 defines a plurality of openings 30, 31, 32 for the passage of laser light, however with a preformed, in particular biconvex optical element 57, 58, 69 arranged in each one thereof, preferably in the form of a spherical lens. Optical elements 57, 58, 69 are each surrounded by a glass solder 60 annularly surrounding the respective optical element 57, 58, 69 in contact with the latter and housing cap 3 to hold it on housing cap 3 in a fluid-tight and hermetically sealing manner. For the sake of clarity, however, only glass solder 60 of optical element 59 has been designated by a reference numeral. Instead of spherical optical elements 57, 58, 69 it is also possible to use other lens shapes for the respective optical elements, as will be explained in more detail below by way of example, and as defined in the appended claims. For example, these may include spherical plano-convex or concavo-convex lenses, spherical or hemispherical lenses, aspherical plano-convex or concavo-convex lenses.

FIG. 36 shows a perspective cross-sectional view of a fifteenth embodiment of multi-laser arrangement 1, in which housing cap 3 has a plurality of openings 30, 31, 32 for the passage of laser light, with a respective preformed, in particular plano-convex optical element 61, 62, 63 held in each one thereof, preferably by a solder glass 64. The in particular plano-convex optical elements 61, 62, 63 were preferably shaped by mechanical polishing.

The optical elements disclosed in FIG. 37 which shows a sixteenth embodiment of multi-laser arrangement 1, each constitute preformed, in particular aspherical optical elements, by way of example, and are in particular fixed on housing cap 3 by having been thermally fused thereto, and/or preferably by mechanical pressure. Only element 65 of these optical elements is designated by a reference symbol, by way of example. In order to be able to apply the necessary mechanical pressure forces, front wall 66 of housing cap 3 is formed with a greater wall thickness. In this case, housing wall 66 may in particular also provide a compression glass seal for optical element 65 pressed into it in a hot state.

FIG. 38 shows a seventeenth embodiment of multi-laser arrangement 1 in which the area facing the light exit face of lasers 6, 7, 8 inside housing 1 and in particular also area 67 of pedestal 5 and of base plate 4 facing transparent element 14 have an absorbent coating. This coating may comprise an absorbent Ni coating, also referred to as dull Ni plating in this technical field. The connection line Z can preferably be gold-plated, in particular in order to increase its conductivity and corrosion resistance.

FIGS. 39 and 41 show an eighteenth embodiment of multi-laser arrangement 1. In this embodiment, the light exiting from a laser 6, 7, 8 is injected into a respective fiber 68, 69, 27 that has its entry end arranged close to the light exit faces of laser 6, 7, 8, see, e.g., also FIG. 41 with a corresponding arrangement of fibers 27, 68, 69.

Each of fibers 27, 68, 69 is held on housing cap 3 by a male-type part 70 of an optical connector 71 and thus forms part of a releasable optical connection, in particular a releasably mateable optical plug-in connection 71, each of which comprises a second, female-type part 72 engaging over male-type part 70 and each holding an external optical fiber 73, 74, 75. female-type part 72 may also hold all external fibers 73, 74, 75 together in a single housing part, so that an optical plug-in connection to multi-laser arrangement 1 is established, which has the potential of greatly simplifying and also standardizing the integration thereof into other existing optical systems.

The nineteenth embodiment of multi-laser arrangement 1 as shown in FIG. 40 differs from the one shown in FIG. 39 substantially by the fact that external fiber 75 is directly routed to light exit face 10, 11, 12 of a respective laser 6, 7, 8 in each case, and that female-type part 72 of optical connector 1 is fixed hermetically tightly on housing cap 3, whereby a permanent connection to housing cap 3 is provided.

FIG. 41 shows a cross-sectional view of a twentieth embodiment of multi-laser arrangement 1, with the sectional plane in parallel to the upper wall of housing cap 3 directly below the upper wall of housing cap 3.

The light exiting from a laser 6, 7, 8 is injected into a respective fiber 68, 69, 27 that has its entry end arranged close to the light exit faces of laser 6, 7, 8, which fiber is fixed on housing cap 3 and is terminated by a plug-in connection 71 with an external fiber 73, 74, 75, as described above for the embodiment of FIG. 39.

An optional lens array 76 or injection lenses 76 may inject the light from lasers 6, 7, 8 into the respective core of the respective fibers 27, 61, 62, preferably matched with their numerical aperture.

Fibers 73, 74 and 75 are combined to form a fiber bundle 77, and the intensity distribution of the fiber bundle at exit end 78 thereof is shown in FIGS. 42A, 42B, and 42D, by way of example.

FIG. 42A shows the intensity distribution at exit end 78 of a bundle 77 of optical fibers coupled to the multi-laser arrangement, perpendicular to the longitudinal extension of fiber bundle 77, in which the individual fibers 73, 74, 75, each one coupled to a laser of the multi-laser arrangement, are arranged next to one another in a plane, as viewed from the direction of arrow P in FIG. 41.

Advantageously, the line direction Ze of an associated imaging device also extends in this plane in which fibers 73, 74, 75 are arranged next to one another, so that during a respective image build-up the colors red, blue, and green are superimposed, and because of this superimposition no splice connection will be required for fibers 73, 74, 75. Consequently, this allows to keep the length of fiber bundle 77 extremely short, in particular at about a few millimeters.

FIG. 42B shows the intensity distribution of optical fibers 73, 74, 75 of a fiber bundle 77, each coupled to multi-laser arrangement 1, at exit end 78 of the bundle perpendicular to the longitudinal extension of fiber bundle 77, in which the individual fibers, each one coupled to a respective laser of the multi-laser arrangement, are positioned next to one another in a spatial arrangement as close as possible, which can be advantageous for further optical systems in which this spatial spacing of fibers 73, 74, 75 is already sufficient to represent an image point, i.e. pixel, of an imaging system.

FIG. 42C shows a cross-sectional view of optical fibers 73, 74, 75 each one coupled to multi-laser arrangement 1, with the sectional plane B-B' as shown in FIG. 41 perpendicular to the longitudinal extension of the fiber bundle at a distance from the exit end thereof, in which the individual fibers 73, 74, 75, each one coupled to a laser 6, 7, 8 of multi-laser arrangement 1, are positioned in a spatial arrangement next to one another as close as possible, and with a diffuser element 79 arranged between fibers 73, 74, 75 and extending along the longitudinal extension of fibers 73, 74, 75. This allows light to be coupled from one fiber 73, 74, 75 into another fiber 73, 74, 75 and thereby provides a central region 80 of mixed light from all fibers 73, 74, 75.

FIG. 42D shows the intensity distribution of optical fiber bundle 77 as shown in FIG. 42C and coupled to multi-laser arrangement 1 at exit end 78 of the bundle perpendicular to the longitudinal extension of fiber bundle 77.

FIG. 43 shows an exemplary perspective view, partially broken-away, of further AR glasses 41', in which multi-laser arrangement 1 according to the invention is connected to a further optical assembly 42 via an optical fiber, in particular via fiber bundle 77.

The inventors have found that in the embodiments of AR glasses shown in FIGS. 33 and 43, for example, deposits may accumulate on transparent element 14 during everyday operation, in particular particulate deposits such as dust particles. Such deposits might scatter and also reflect back the light emitted by lasers 6, 7, 8. An exemplary deposit in the form of a grain of dust, St, is shown in FIG. 4 by way of example, and is enlarged for the sake of clarity. This may have detrimental effects, for example if part of the back-reflected light enters the cavity of one of lasers 6, 7, or 8 and causes coupling with the resonator modes therein, which may lead to an effect known as mode hopping resulting in undesirable fluctuations in the intensity of the laser light.

In contrast to the majority of the conventional applications, a deformation of housing 2 of the embodiments of AR glasses shown in FIGS. 33 and 43 may furthermore cause transparent element 14 together with deposits, St, provided thereon to be displaced relative to lasers 6, 7, 8 thereby altering the distance or the inclination of transparent element 14 relative to the respective light exit surface 10, 11, 12 of lasers 6, 7, 8. Such deformations may occur, for example, when the temple arm of the AR glasses is bent, for example due to a mismatch to the user who is wearing them.

Furthermore, in the embodiments shown in FIGS. 10, 17, 18, 26, 29, 30, in FIG. 31 on the left, and in FIGS. 32A, 32B, 38, even if transparent element 14 is correctly placed during fabrication, deformation of housing 2 may cause light reflected on transparent element 14 to directly re-enter the cavity of one of lasers 6, 7, or 8, and in this case even with a significantly higher intensity than in the case where deposits, St, are present on transparent element 14.

Although such fluctuations in the emitted intensity will not always be perceptible to the naked eye, they may however be disruptive, even in the case of very fast electronic intensity control, and may interact with this intensity control in an undesirable way, since such intensity fluctuations usually comprise low-frequency components as caused by the deformation and higher-frequency components as caused by the mode hopping.

Other than in assemblies of conventional optoelectronic devices which are usually arranged in an encapsulated environment, the deformations occurring in everyday use of AR glasses of the presently disclosed embodiments, for example, may already become significant when the distance of the transparent element changes by about half the wavelength of the light emitted by the lasers, since this may already suffice to change a positive interference of the back-reflected light into a negative interference and may impact respective other areas within the respective cavity of one of the lasers. Such undesirable changes in distance are thus in a range of only about 200 nm to 350 nm.

The impact of such deformations is particularly crucial in embodiments in which the main direction of laser emission is substantially parallel to base plate 4 of housing 2, which is true for presently disclosed embodiments, because in this case deformations of base plate 4 directly cause a change in the inclination or distance of transparent element 14 relative to the respective light exit surface 10, 11, 12 of lasers 6, 7, 8.

This effect is less pronounced in designs in which the main direction of laser emission is not substantially parallel but rather in particular perpendicular to the base plate of a housing, because in such embodiments a warp of the base plate would have less influence on the distance between the respective lasers and a respective exit window.

In further prior art designs, a solid base plate can be made integrally with the side walls of the housing by milling, which, however, is complex in terms of manufacturing, especially for designs with inclined walls of the respective housing cap.

At this point, another technical problem is encountered with designs that have extremely compact dimensions, as is the case with those presently disclosed, since the closer the light exit faces 10, 11, 12 of lasers 6, 7, 8 are to transparent element 14, the higher might be the intensity of the light reflected back into the laser cavities by the aforementioned deposits. This intensity decreases with the square of the distance mentioned above and would require the largest possible value for L, which is in direct contradiction to a compact design. Here, L denotes the distance between the front side of pedestal 5 in the main emission direction of lasers 6, 7, or 8 and the edge of base plate 4 located in the main emission direction of lasers 6, 7, or 8, and it is a crucial value for the following disclosure, since the greater the value of L, the lower will be the strength or mechanical stability of housing 2 without further measures.

Furthermore, in the embodiments shown in FIGS. 1, 2, 4, 8, 9, 11, 12, 14, 19, 20, 21, 22, 32C, 32D, for example, pedestal 5 cannot be arranged arbitrarily close to the wall of housing cap 3 on which transparent element 14 is attached, because of the inclination of this wall, and must consequently be formed set back with respect thereto, which necessarily increases the length L compared to embodiments with substantially perpendicular walls of housing cap 3.

In order to avoid shading of the light emitted by lasers 6, 7, 8, the distance L can be limited in length in further embodiments as well, as shown in FIGS. 25 and 26, by way of example.

In the designs as disclosed in WO 2020/004100 A1, for example, the path of the laser light is considerably prolonged by beam-deflecting components such as at least partially spectrally reflecting mirrors, and so is the distance for light reflected back into respective laser cavities, so that the intensity of back-reflected light will be considerably lower than in the presently disclosed embodiments.

However, in the present embodiments, no beam deflecting components are provided within housing 2 defined by base plate 4 and housing cap 3 with transparent element 14, in particular no at least partially reflective components such as mirrors or dichroic beam splitters or beam combiners, in particular for the sake of a compact housing design and very flexible use applications. The exemplary embodiments illustrated in FIGS. 29 and 30 are proposed as alternative embodiments in which the dichroic beam splitters or beam combiners 38, 39, 40 are located outside housing 2, which however does not result in a prolongation of the path of light back-reflected by deposits St into the laser cavities as disclosed in WO 2020/004100 A1, for example.

However, if light from lasers 6, 7, 8 is to be detected for metrological purposes, in particular for feedback control of the intensity of the light emitted by lasers 6, 7, 8, it suffices to capture the light exiting from the rear side of lasers 6, 7, 8 and reflected on housing cap 3 or the light reflected on transparent element 14, without having to accept significantly larger sizes of housing 2.

However, housing cap 3 or transparent element 14 are not used or referred to as mirrors or dichroic beam splitters or beam combiners in this case, since they are substantially not used to influence the guidance of the beam from lasers 6, 7, 8 exiting housing 2.

In order to provide a compact housing design that can be fabricated cost-efficiently from a manufacturing point of view, it would also be advantageous to use a housing cap 3 made by deep drawing, which should already provide sufficient mechanical strength when appropriately fastened to base plate 4, as is the case with embodiments of multi-laser arrangements 1 presently disclosed.

The inventors have found that the aforementioned distance L between the front side of pedestal 5 in the main emission direction of lasers 6, 7, or 8 and the edge of base plate 4 located in the main emission direction of lasers 6, 7 or 8, i.e. in the X direction, can have a crucial impact on this stability, since a deformation or bending of this area has a significant impact on the distance between light exit surface 10, 11, 12 of lasers 6, 7, 8 and transparent element 14. In FIG. 6 this distance is denoted by L and the thickness of base plate 4 is denoted by W.

The wording "thickness W of base plate 4" relates to the respective parallel area of the upper and lower surfaces of base plate 4 at those locations where base plate 4 has no elevations on its upper side. In these embodiments, the thickness W of base plate 4 is preferably in a range from 0.1 to 1 mm and is particularly preferably in a range from 0.2 to 0.5 mm.

In the embodiments shown in FIGS. 10, 17, 18, 23, 24, 25, 26, 29, 30, 31, 32A, and 32B, with walls extending essentially perpendicular to base plate 4 and accordingly with a transparent element 14 arranged perpendicular, the distance L was preferably approximately between 0.7 and 2 mm and especially preferred between 0.9 and 1.7 mm, since in these cases deposits are less likely to be feared than in embodiments with an inclined transparent element 14, and the short distance L and the ratio V of length L to thickness W of the base plate discussed below resulted in very stable housings 2.

In these housing designs for the ratio V of length L to thickness W of the base plate, V=L/W for the preferred embodiments, a value of 3.4 to 4.5 was achieved, with smaller values of V providing greater stability of the housing. In general, however, values of V from 2 to 7 could be used for these embodiments.

However, in the embodiments with an inclined transparent element 14 as illustrated in FIGS. 1, 2, 4, 8, 9, 11, 12, 14, 19, 20, 21, 22, FIG. 31 on the right, and in FIGS. 32C, 32D, a value of approximately 2 mm to 4 mm, preferably of 2.7 to 3 mm was used for distance L. The thickness W of the base. plate in these embodiments is also preferably in a range from 0.1 to 1 mm and is particularly preferably in a range from 0.2 to 0.5 mm.

These values gave for the ratio V of the length L to the thickness of the base plate W, V=L/W, for the preferred embodiments a value of 6.6 to 13.5 In general, however, values for V of 4 to 20 could be used for these embodiments.

The higher values of V were also able to provide very stable housings in these designs, since the inclination of the wall of housing cap 3 to which transparent element 14 is attached, as disclosed here, provided a further increased strength-increasing effect through housing cap 3.

In general, base plates 4 with a greater thickness would have led in each case to a more stable design of housing 2, but it was surprising to see that even the thickness of base plate 4 of 0.2 to 0.5 mm used in the preferred embodiments was already able to provide sufficient stability in an extremely compact housing design.

In the context of the present disclosure, it is furthermore assumed that in the preferred embodiments pedestal 5 rises above base plate 4 in a substantially cuboid shape with walls that extend vertically in the Z direction thereby imparting it additional stability against deformation or warp. These geometric relationships are also shown in FIG. 6, by way of example.

In the context of the present disclosure, base plate 4 is understood to be that housing component from which the electrical connection lines Z, and in particular Z6, Z7, and Z8 emerge and where multi-laser arrangement 1 is usually joined to further external assemblies, which is a fundamental difference of the presently disclosed embodiments compared to vertically emitting arrangements.

Generally, transparent element 14 has proven to be a very advantageous component that increases the strength of housing 2. It allowed to considerably increase shear rigidity of housing 2, in particular, when fixed on housing cap 3 by a gold solder A, in particular AuSn solder, or by a frame R. A preferred thickness Dt of the transparent element, see, e.g., the view in FIG. 31 on the left, was about 0.2 mm to 0.6 mm, preferably 0.25 mm or 0.5 mm.

Simulations were performed in order to obtain a general understanding of the effect of external forces on housing 2 and thus to obtain a mechanically stable arrangement which is able to mitigate or even virtually eliminate the drawbacks of back-reflected light as described above, even with extremely compact designs that are also advantageous in terms of manufacturing techniques.

These embodiments used for load testing by simulation, which can also be implemented accordingly in the other embodiments disclosed herein, used a deep-drawn housing cap 3 made of a deep-drawable nickel alloy, and a base plate 3 made of cold-rolled CRS1010 steel.

A weld seam S as illustrated in FIG. 9 was created between housing cap 3 and base plate 4, extending substantially over the entire contact surface between housing cap 3 and base plate 4 below a lateral projection As of housing cap 3, which defines a welding flange, where the width of the lateral projection is about 0.2 to 0.5 mm.

This provided a circumferential bond between housing cap 3 and base plate 4, which was continually mechanically stable even under the conditions of the present test.

FIG. 44 shows an exemplary perspective view of a base plate 4 with a pedestal 5 arranged thereon on which the mechanical load test was performed by simulation.

During this load test, base plate 4 was fixed with portion B shown in FIG. 45 and delimited by dash-dotted lines, so that it could not deform in this portion B.

In order to simulate effects of forces occurring in everyday operational use in the most appropriate way, a force as represented by the force vector Kf was introduced into base plate 4 with a thickness W of 0.25 mm, in the Z direction, as shown in FIG. 45 and also in the further load tests presently disclosed.

As shown in FIG. 45, the point of application of the force vector Kf was at a corner laterally of base plate 4 opposite portion B. The introduced force was of a magnitude of 1 N in all of the load tests presently disclosed.

When the multi-laser arrangement is arranged on the temple arm of AR glasses 41, 41' as shown in FIGS. 33 and 43, portion B corresponds to a rear portion closer to the ear of a wearer of AR glasses 41, 41', and the point at which the force vector Kf is applied corresponds to a portion of the temple arm of the respective AR glasses 41, 41' that is more distant from the ear of the respective wearer of the AR glasses. In this way, typical mechanical loads occurring in everyday operation were reproduced.

In a first test, no housing cap 3 was placed on base plate 4, in order to better understand the general behavior of base plate 4 with a thickness of 0.25 mm.

FIG. 46 shows the deformations resulting from the load test, which were in a range of up to a maximum of 1.9 mm in the area below force vector Kf.

This result already clearly shows that base plate 4 per se, without further stabilizing measures, is not suitable on its own to provide the required stability.

Thus, the combination of housing cap 3 and base plate 4, especially with pedestal 5 arranged thereon, is of considerable importance for the overall resulting stability.

FIG. 47 shows an embodiment of a base plate 4 with a housing cap 3 fixed thereon according to a presently disclosed multi-laser arrangement 1 in which the thickness of the base plate is again 0.25 mm and the thickness Wg of the material of housing cap 3 amounts to 0.15 mm.

As in the load test described further below with reference to FIGS. 49 and 50, pedestal 5 was fixed on base plate 4 in each case, in order to allow to identify the deformations of housing 2 of the multi-laser arrangement 1 as realistically as possible.

FIG. 48 shows the results of the load test of the embodiment shown in FIG. 47, with a base plate 4 and a housing cap 3 fixed thereon and a pedestal 5, and it can be seen that the maximum deformation was only about 0.68 mm.

Thus, with housing cap 3 and pedestal 5, the deformation of base plate 4 was considerably reduced.

FIG. 49 shows a further embodiment of a base plate 4 with a housing cap 3 fixed thereon and with a pedestal 5 joined to the base plate according to a presently disclosed multi-laser arrangement 1. In this embodiment, housing cap 3 has a portion of the side walls in the form of a portion 81 that is offset laterally outwards. The height H of lateral portion 81 is approximately 0.5 mm and may range from 0.3 to 1 mm. The amount B by which portion 81 is offset outwards is approximately 0.4 mm and may range from 0.2 to 1 mm.

In this embodiment mentioned above and shown in FIGS. 49 and 50, the base plate has a thickness W of 0.1 mm, and the thickness Wg of the material of the housing cap is 0.5 mm.

FIG. 50 shows the results of the load test by simulated predefined introduction of a force into the base plate for the further embodiment shown in FIG. 49. Surprisingly, maximum deformation of the housing was only 0.23 mm. However, this deformation essentially only takes place outside the projection. The rest of the housing inside the laterally outwardly offset section 81 only deforms by less than 0.016 mm.

Since the thickness of the base plate directly contributes to the height of housing 2, it should consequently, as mentioned before, not be unnecessarily large, in view of a most compact design possible, but should rather be selected as small as possible. The embodiment described next shows a very advantageous configuration in which the housing is imparted considerable additional strength without, however, unnecessarily increasing its height.

In this further preferred embodiment, base plate 4, at least with its lateral edge, may extend at least partially or completely inside the laterally offset portion 81 and engage thereon from inside in a form-fitting manner.

In this embodiment, weld seam S may then extend laterally between base plate 4 and portion 81, in particular all along the inner circumference of portion 81 and the lateral edge Rs of base plate 4.

Given the above disclosure, a preferred embodiment resulting for multi-laser arrangement 1 includes:
  a deep-drawn housing cap 3 comprising or made of a deep-drawable material;
  a base plate 3 with a ratio V of L to W, V=L/W,
    from 2 to 7, preferably from 3.4 to 4.5 in the case of a transparent element 14 arranged perpendicular relative to base plate 4, i.e. in the normal direction of base plate 4; and
    from 4 to 20, preferably from 6 to 13.5, in the case of a transparent element 14 arranged with an inclination relative to base plate 4, wherein
      the angle of inclination of the wall of the housing cap on which transparent element 14 is arranged then ranges from 35° to 60°, preferably from 40° to 50°, most preferably from 43° to 48°, relative to the normal direction of the lower surface of the base plate.

In this embodiment, transparent element 14 may advantageously be fixed to housing cap 3 by a gold solder A, in particular an AuSn solder, or by a frame R, in particular to increase shear strength.

Advantageously, in particular in order to increase strength, housing cap 3 has a laterally outwardly offset portion 81, which is in particular provided in the lower portion thereof, adjoining base plate 4.

The base plate 4 may extend at least partially or completely inside the laterally outwardly offset portion, at least with its lateral edge Rs, and can engage thereon from inside in a form-fitting manner.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

LIST OF REFERENCE SYMBOLS

1 Multi-laser arrangement, in particular RGB module
2 Housing
3 Housing cap
4 Base plate
5 Pedestal
6 First laser, emitting in the red spectral range of the visible spectrum
7 Second laser, emitting in the green spectral range of the visible spectrum
8 Third laser, emitting in the blue spectral range of the visible spectrum
9 Lower surface or underside of base plate 4
10 Light exit face of laser 6
11 Light exit face of laser 7
12 Light exit face of laser 8
13 Opening of housing cap 3
14 Transparent element
15 Fast Axis Collimation (FAC) lens
16 Plane-parallel substrate
17 Fiberboard
18 Fast Axis Collimation (FAC) lens
19 Monitor diode
20 Monitor diode
21 Monitor diode
22 Exit face of FAC lens
23 Carrier of monitor diodes 19, 20, 21
24 Conductor on surface of carrier 23
25 Conductor on surface of carrier 23
26 Injection end of fiber 27
27 Fiber
28 Fused glass
29 Fused glass
30 Opening of housing cap 3
31 Opening of housing cap 3
32 Opening of housing cap 3
33 Protective means for the glass of transparent element 14
34 Portion laterally protruding beyond transparent element 14
35 Beam collimator
36 Beam collimator
37 Beam collimator
38 Dichroic beam splitter or beam combiner
39 Dichroic beam splitter or beam combiner
40 Dichroic beam splitter or beam combiner
41 AR glasses
41' AR glasses
42 Optical assemblies
43 Projection device
44 Sensor
45 Sensor
46 Sensor
47 Exchangeable lens
48 Processor
49 Wireless transmitter module, in particular 5G module
50 Rechargeable battery
51 Safety means
52 Hot molded optical element
53 Hot molded optical element
54 Hot molded optical element
55 Circumferential annular flange
56 Annular circumferential recess or groove
57 Preformed, in particular biconvex optical element, preferably in the form of a spherical lens
58 Preformed, in particular biconvex optical element, preferably in the form of a spherical lens
59 Preformed, in particular biconvex optical element, preferably in the form of a spherical lens
60 Solder glass of a glass solder
61 Plano-convex optical element
62 Plano-convex optical element
63 Plano-convex optical element 64 Solder glass of a glass solder
65 Optical element, in particular preformed, in particular aspherical optical element
66 Front wall of housing cap 3
67 Portion of pedestal 5 facing the transparent element 14
68 Fiber
69 Fiber
70 Male-type part of optical connector 71 as part of a releasable optical connection, in particular of a releasably mateable optical plug-in connection 71
71 Releasably mateable optical plug-in connection
72 Female-type part of optical connector 71 as part of a releasable optical connection, in particular of a releasably mateable optical plug-in connection 71
73 External optical fiber
74 External optical fiber
75 External optical fiber
76 Optional lens arrangement
77 Fiber bundle
78 Exit end of fiber bundle
79 Diffuser element
80 Region of mixed light from fibers 73, 74, 75
81 Portion of housing cap 3 laterally offset outwardly
A Gold solder, in particular AuSn solder
As Lateral projection of housing cap 3
B Portion of base plate fixed for the stress test
Ba Width of near-edge gold solder layer
Bg Width of near-edge glass solder layer
B6 Bonding wire
B7 Bonding wire
B8 Bonding wire
Dt Thickness of transparent element 14
E6 Depression in upper surface of pedestal 5 for form-fitting and in particular aligned accommodation of laser 6
E7 Depression in upper surface of pedestal 5 for form-fitting and in particular aligned accommodation of laser 7
E8 Depression in upper surface of pedestal 5 for form-fitting and in particular aligned accommodation of laser 8
G Glass solder
H Height of lateral projection of housing cap 3
Ha Height of housing 2 of rectangular cross section shown in FIG. 18, in which gold solder A was used
Hg Height of housing 2 of rectangular cross section shown in FIG. 17, in which glass solder G was used
Hs Beam diameter in Z direction of light beams leaving the lasers 6, 7, or 8 in the respective main emission direction H6, H7, or H8
H6 to H8 Main emission direction of lasers 6, 7, and 8, respectively
Kf Force vector of force to be introduced during load test
L Distance from the front side of pedestal 5 in the main emission direction of lasers 6, 7, or 8 to the edge of base plate 4 located in the main emission direction of lasers 6, 7, or 8
N Normal direction of lower surface 9 of base plate 4
Nt Normal direction of the surface of carrier 23 on which the monitor diodes 19, 20, 21 are arranged
Nw Normal direction of the surface of the wall of housing cap 3 on which the transparent element 14 is arranged
OE6 Countersunk surface of depression E6
OE7 Countersunk surface of depression E7
OE8 Countersunk surface of depression E8
P Arrow in viewing direction to fiber end 78 of fiber bundle 77
R Frame carrying the transparent element 14
Rs Lateral edge of base plate 4
S Weld seam between housing cap 3 and base plate 4
T Blackening, in particular a paint or coating such as a black chrome coating or a zinc-nickel coating, in particular also electrolytic coating
W Thickness of base plate, in particular along distance L
Wg Thickness of the material of housing cap 3
Z Connection line, in particular electrical connection line to a laser
Z6 Connection line, in particular electrical connection line to laser 6
Z7 Connection line, in particular electrical connection line to laser 7
Z8 Connection line, in particular electrical connection line to laser 8
Z19 Connection line to monitor diode 19
Z20 Connection line to monitor diode 20
Z21 Connection line to monitor diode 21
Ze Line direction of associated imaging device

What is claimed is:

1. A multi-laser arrangement, in particular an RGB laser module, comprising:
    a housing including:
        a housing cap having at least one opening formed therein, and a transparent element associated therewith for passing electromagnetic radiation; and;
        a base plate;
    a first laser emitting light in the red spectral range of the visible spectrum;
    a second laser emitting light in the green spectral range of the visible spectrum;
    a third laser emitting in light in the blue spectral range of the visible spectrum, the first, second and third lasers being arranged within the housing;
    an electrical connection line routed through the housing to each respective laser; and
    wherein, during operation of the lasers, a majority of the laser's emitted light passes through the transparent element;
    wherein each laser
        (i) is arranged on a pedestal in the housing;
        (ii) is arranged spaced apart from the lower surface of the base plate; and
        (iii) is aligned with one another;
    wherein a main direction of laser emission is substantially parallel to the base plate of the housing, wherein the housing has a protective means for the transparent element in the form of a portion laterally protruding beyond the transparent element.

2. The multi-laser arrangement of claim 1, wherein the housing cap comprises metal or is made of metal and the base plate comprises metal or is made of metal, and the housing cap is joined to the base plate by welding.

3. The multi-laser arrangement of claim 1, wherein the pedestal is formed integrally with the base plate.

4. The multi-laser arrangement of claim 1, wherein the base plate comprises or is made of a metal including cold-rolled CRS1010 steel, and wherein the pedestal is made of or comprises a different material than the base plate, the different material including oxygen-free high conductivity (OFHC) copper; and wherein the pedestal is pressed, soldered or welded to the base plate.

5. The multi-laser arrangement of claim 1, wherein a fast axis collimation (FAC) lens is arranged on the pedestal spaced apart from an end face of one of the lasers.

6. The multi-laser arrangement of claim 1, wherein the transparent element comprises glass or sapphire or is made of glass or sapphire.

7. The multi-laser arrangement of claim 6, wherein the transparent element is fixed on the housing cap or on a frame arranged on the housing cap by a glass solder.

8. The multi-laser arrangement of claim 6, wherein the transparent element is fixed on the housing cap by AuSn.

9. The multi-laser arrangement of claim 6, wherein the transparent element is welded to the housing cap.

10. The multi-laser arrangement of claim 1, wherein the transparent element is in the form of a fast axis collimation (FAC) lens or comprises a fast axis collimation (FAC) lens.

11. The multi-laser arrangement of claim 1, wherein the transparent element is in the form of a fiber board or comprises a fiber board.

12. The multi-laser arrangement of claim 1, wherein at least that wall of the housing cap on which the transparent element is arranged is inclined relative to the base plate, with an angle of inclination of the wall of the housing cap relative to the normal direction of the lower surface of the base plate in a range from 35° to 60°, preferably from 40° to 50°, most preferably from 43° to 48°.

13. The multi-laser arrangement of claim 1, further comprising a monitor diode is arranged below the transparent element so that laser light is reflected back from the transparent element and is incident on the monitor diode.

14. The multi-laser arrangement of claim 1, wherein a normal direction of at least that wall of the housing cap on which the transparent element is arranged is inclined relative to a main emission direction of at least one of the lasers, with an inclination relative to the main emission direction in an angular range from 3° to 15°, preferably from 5° to 10°, most preferably from 6° to 8°.

15. The multi-laser arrangement of claim 1, further comprising monitor diodes positioned behind the lasers on a carrier associated therewith.

16. The multi-laser arrangement of claim 15, wherein the monitor diodes are arranged on the carrier which preferably comprises ceramics or is made of ceramics, and wherein a normal direction of the surface of the carrier on which the monitor diodes are arranged is inclined relative to a main emission direction of at least one of the lasers, with an inclination relative to the main emission direction in an angular range from 3° to 15°, preferably from 5° to 10°, most preferably from 6° to 8°.

17. The multi-laser arrangement of claim 16, wherein the monitor diodes include color filters.

18. The multi-laser arrangement of claim 1, wherein the housing cap has a plurality of openings, wherein each of these openings has a respective transparent element associated therewith, or wherein all of these openings share one common transparent element associated therewith.

19. The multi-laser arrangement of claim 1, wherein the housing cap has a plurality of openings, with a respective transparent element arranged at each one of the openings, the transparent element being in the form of a beam-shaping optical element selected from the group of optical elements consisting of: spherical plano-convex and concavo-convex lenses, spherical lenses, hemispherical lenses, aspherical plano-convex and concavo-convex lenses.

20. The multi-laser arrangement of claim 1, further comprising an optical fiber connected to the housing cap by a fiber connector, the fiber connector being a releasably mateable fiber connector or a permanently mateable fiber connector.

21. The multi-laser arrangement of claim 20, wherein each laser has an optical fiber associated therewith, and wherein the fibers associated to the lasers are combined in a fiber bundle in which they are packed close to one another with their respective fiber cores and share a common fiber cladding surrounding the fiber cores.

22. The multi-laser arrangement of claim 1, further comprising monitor diodes and glass-metal feedthroughs for connection lines to the lasers and/or to the monitor diodes.

23. The multi-laser arrangement of claim 1, wherein the housing is fluid-tight and hermetically sealed and the atmosphere within the housing has an $H_2O$ content of less than 5000 ppm.

24. The multi-laser arrangement of claim 1, wherein the base plate of the housing is designed as a reference potential and is current-carrying.

25. The multi-laser arrangement of claim 1, wherein the base plate serves as a carrier for optical assemblies and the base plate protrudes from below the housing cap.

26. The multi-laser arrangement of claim 1, wherein an inner surface of the housing cap is blackened with a matt finish.

27. The multi-laser arrangement of claim 1, wherein the housing has housing dimensions with a height from 1.0 mm to 3.5 mm and/or a width from 4 mm to 10 mm and/or a length from 4 to 10 mm.

28. The multi-laser arrangement of claim 1, wherein an interior of the housing is free of mirrors, is free of at least partially reflecting mirrors, and/or free of dichroic elements.

29. The multi-laser arrangement of claim 1, wherein the base plate has a ratio V of L to W (V=L/W),
from 2 to 4, preferably from 3.4 to 4.5 when the transparent element is arranged perpendicular relative to the base plate; and
from 4 to 20, preferably from 6.6 to 13.5, when the transparent element is arranged with an inclination relative to the base plate;
wherein L is the distance from a front side of the pedestal in a main emission direction of the lasers to an edge of the base plate located in the main emission direction of the lasers; and
wherein W is a thickness of the base plate along the distance L.

30. The multi-laser arrangement of claim 1, wherein the housing cap has a laterally outwardly offset portion provided in the lower portion thereof adjoining the base plate.

31. The multi-laser arrangement of claim 30, wherein the base plate extends with its lateral edge at least partially or completely inside the laterally outwardly offset portion and engages thereon from inside in a form-fitting manner.

32. A head-mounted display in the form of Augmented Reality (AR) glasses or spectacles, comprising a multi-laser arrangement according to claim 1, wherein the multi-laser arrangement is arranged on the AR glasses or spectacles, or to which the multi-laser arrangement is connected by an optical fiber to the AR glasses or spectacles.

33. A projector comprising a multi-laser arrangement according to claim 1, on which the multi-laser arrangement is arranged or to which the multi-laser arrangement is connected by an optical fiber.

34. A multi-laser arrangement, in particular an RGB laser module, comprising:
a housing including:
a housing cap having at least one opening formed therein, and a transparent element associated therewith for passing electromagnetic radiation; and
a base plate;
a first laser emitting light in the red spectral range of the visible spectrum;
a second laser emitting light in the green spectral range of the visible spectrum;

a third laser emitting in light in the blue spectral range of the visible spectrum, the first, second and third lasers being arranged within the housing;

an electrical connection line routed through the housing to each respective laser; and wherein, during operation of the lasers, a majority of the laser's emitted light passes through the transparent element;

wherein each laser
(i) is arranged on a pedestal in the housing;
(ii) is arranged spaced apart from the lower surface of the base plate; and
(iii) is aligned with one another;

wherein a main direction of laser emission is substantially parallel to the base plate of the housing, the multi-laser arrangement further comprising monitor diodes positioned behind the lasers on a carrier associated therewith, wherein the monitor diodes are arranged on the carrier which includes ceramics or is made of ceramics, and wherein a normal direction of the surface of the carrier on which the monitor diodes are arranged is inclined relative to a main emission direction of at least one of the lasers, with an inclination relative to the main emission direction in an angular range from 3° to 15°, preferably from 5° to 10°, most preferably from 6° to 8°.

35. A multi-laser arrangement, in particular an RGB laser module, comprising:
a housing including:
a housing cap having at least one opening formed therein, and a transparent element associated therewith for passing electromagnetic radiation; and
a base plate;
a first laser emitting light in the red spectral range of the visible spectrum;
a second laser emitting light in the green spectral range of the visible spectrum;
a third laser emitting in light in the blue spectral range of the visible spectrum, the first, second and third lasers being arranged within the housing;
an electrical connection line routed through the housing to each respective laser; and
wherein, during operation of the lasers, a majority of the laser's emitted light passes through the transparent element;
wherein each laser
(i) is arranged on a pedestal in the housing;
(ii) is arranged spaced apart from the lower surface of the base plate; and
(iii) is aligned with one another;
wherein a main direction of laser emission is substantially parallel to the base plate of the housing, the multi-laser arrangement further comprising glass-metal feedthroughs for connection lines to the lasers.

36. A multi-laser arrangement, in particular an RGB laser module, comprising:
a housing including:
a housing cap having at least one opening formed therein, and a transparent element associated therewith for passing electromagnetic radiation; and
a base plate;
a first laser emitting light in the red spectral range of the visible spectrum;
a second laser emitting light in the green spectral range of the visible spectrum;
a third laser emitting in light in the blue spectral range of the visible spectrum, the first, second and third lasers being arranged within the housing;
an electrical connection line routed through the housing to each respective laser; and
wherein, during operation of the lasers, a majority of the laser's emitted light passes through the transparent element;
wherein each laser
(i) is arranged on a pedestal in the housing;
(ii) is arranged spaced apart from the lower surface of the base plate; and
(iii) is aligned with one another;
wherein a main direction of laser emission is substantially parallel to the base plate of the housing,
wherein the base plate has a ratio V of L to W (V=L/W),
from 2 to 4.5, preferably from 3.4 to 4 when the transparent element is arranged perpendicular relative to the base plate; and
from 4 to 20, preferably from 6.6 to 13.5, when the transparent element is arranged with an inclination relative to the base plate;
wherein L is the distance from a front side of the pedestal in a main emission direction of the lasers to an edge of the base plate located in the main emission direction of the lasers; and
wherein W is a thickness of the base plate along the distance L.

* * * * *